(12) United States Patent
Shimura

(10) Patent No.: US 11,049,867 B2
(45) Date of Patent: Jun. 29, 2021

(54) SEMICONDUCTOR MEMORY DEVICE INCLUDING AN ASYMMETRICAL MEMORY CORE REGION

(71) Applicant: Toshiba Memory Corporation, Minato-ku (JP)

(72) Inventor: Yasuhiro Shimura, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/228,719

(22) Filed: Aug. 4, 2016

(65) Prior Publication Data

US 2017/0271345 A1   Sep. 21, 2017

Related U.S. Application Data

(60) Provisional application No. 62/309,981, filed on Mar. 18, 2016.

(51) Int. Cl.

| H01L 27/11556 | (2017.01) |
|---|---|
| H01L 27/11582 | (2017.01) |
| G11C 16/28 | (2006.01) |
| G11C 16/14 | (2006.01) |
| G11C 16/08 | (2006.01) |
| G11C 16/04 | (2006.01) |

(52) U.S. Cl.
CPC .... *H01L 27/11556* (2013.01); *G11C 16/0483* (2013.01); *G11C 16/08* (2013.01); *G11C 16/14* (2013.01); *G11C 16/28* (2013.01); *H01L 27/11582* (2013.01)

(58) Field of Classification Search
CPC ........... H01L 27/1157; H01L 27/11582; H01L 27/11563; H01L 27/11568; H01L 29/1037; G11C 16/0483; G11C 16/08; G11C 16/10; G11C 16/14; G11C 16/28
See application file for complete search history.

(56) References Cited

U.S. PATENT DOCUMENTS

| 8,030,700 B2 | 10/2011 | Sakamoto |
|---|---|---|
| 8,912,594 B2 | 12/2014 | Fujiki et al. |
| 2013/0248974 A1 | 9/2013 | Alsmeier et al. |

(Continued)

FOREIGN PATENT DOCUMENTS

| JP | 2010-34112 | 2/2010 |
|---|---|---|
| JP | 2013-187337 | 9/2013 |

*Primary Examiner* — Brigitte A Paterson
(74) *Attorney, Agent, or Firm* — Oblon, McClelland, Maier & Neustadt, L.L.P.

(57) ABSTRACT

According to embodiments, a semiconductor memory device includes a plurality of control gate electrodes laminated above a substrate and extend in a first direction and a second direction, and a memory pillar that has one end connected to the substrate, has longitudinally a third direction intersecting with the first direction and the second direction, and is opposed to the plurality of control gate electrodes. The memory pillar includes a core insulating layer and a semiconductor layer arranged around the core insulating layer. The semiconductor layer includes a first portion and a second portion positioned at a substrate side of the first portion. A width in the first direction or the second direction of the semiconductor layer at at least a part of the first portion is larger than a width in the first direction or the second direction of the second portion.

3 Claims, 32 Drawing Sheets

ENLARGED PART A

(56) References Cited

U.S. PATENT DOCUMENTS

| | | | |
|---|---|---|---|
| 2015/0102399 A1* | 4/2015 | Sakuma | H01L 27/11582 257/324 |
| 2016/0005760 A1* | 1/2016 | Lee | H01L 27/11582 257/324 |
| 2017/0162592 A1* | 6/2017 | Nishikawa | H01L 28/20 |

* cited by examiner (ENLARGED PART A IN FIG. 5)

ENLARGED PART A

ENLARGED PART A

ENLARGED PART A

ENLARGED PART A

ENLARGED PART A

SEMICONDUCTOR MEMORY DEVICE INCLUDING AN ASYMMETRICAL MEMORY CORE REGION

CROSS REFERENCE TO RELATED APPLICATIONS

This application is based on and claims the benefit of priority from prior U.S. Provisional Patent Application No. 62/309,981, filed on Mar. 18, 2016, the entire contents of which are incorporated herein by reference.

BACKGROUND

Field

Embodiments described herein relate generally to a semiconductor memory device and a method of manufacturing the same.

Description of the Related Art

There has been known a flash memory that accumulates charges on a charge accumulation layer to store data. Such flash memory is connected by various methods such as a NAND type and a NOR type, thus configuring a semiconductor memory device. Recently, for large capacity and high integration of such semiconductor memory device, a semiconductor memory device in which memory cells are three-dimensionally disposed (three-dimensional semiconductor memory device) has been proposed.

DETAILED DESCRIPTION

A semiconductor memory device according to embodiments described below includes a plurality of control gate electrodes, a memory pillar, a plurality of memory cells included in a memory string, a dummy cell connected to the memory cell in series, and a select gate transistor connected to the dummy cell in series. The plurality of the memory cells and the dummy cell are coupled to the plurality of the control gates. The plurality of control gate electrodes are laminated above a substrate and extend in a first direction and a second direction. The memory pillar has one end connected to the substrate, has longitudinally a third direction intersecting with the first direction and the second direction, and is opposed to the plurality of control gate electrodes. The memory pillar includes a core insulating layer, a semiconductor layer arranged around the core insulating layer, and a memory layer including a charge accumulation layer arranged around the semiconductor layer. The semiconductor layer includes a first portion and a second portion positioned at a substrate side of the first portion. A width in the first direction or the second direction of the semiconductor layer at at least a part of the first portion is larger than a width in the first direction or the second direction of the second portion.

The following describes non-volatile semiconductor memory devices according to embodiments in detail with reference to the accompanying drawings. Here, these embodiments are only examples, and are not described for the purpose of limiting the present invention. The respective drawings of the non-volatile semiconductor memory devices used in the following embodiments are schematically shown. The thickness, the width, the ratio, and a similar parameter of the layer are different from actual parameters.

The following embodiments relate to a non-volatile semiconductor memory device in a structure where a plurality of metal-oxide-nitride-oxide-semiconductor (MONOS) type memory cells (transistors) are laminated and disposed in a certain direction. The MONOS type memory cell includes: a semiconductor layer disposed in a columnar shape in the certain direction as a longitudinal direction as a channel, and a gate electrode layer disposed on the side surface of the semiconductor layer via a charge accumulation layer.

However, this is not also intended to limit the present invention. The present invention is applicable to another type of charge accumulation layer, for example, a semiconductor-oxide-nitride-oxide-semiconductor (SONOS) type memory cell or a floating-gate type memory cell.

First Embodiment

Figure 1:
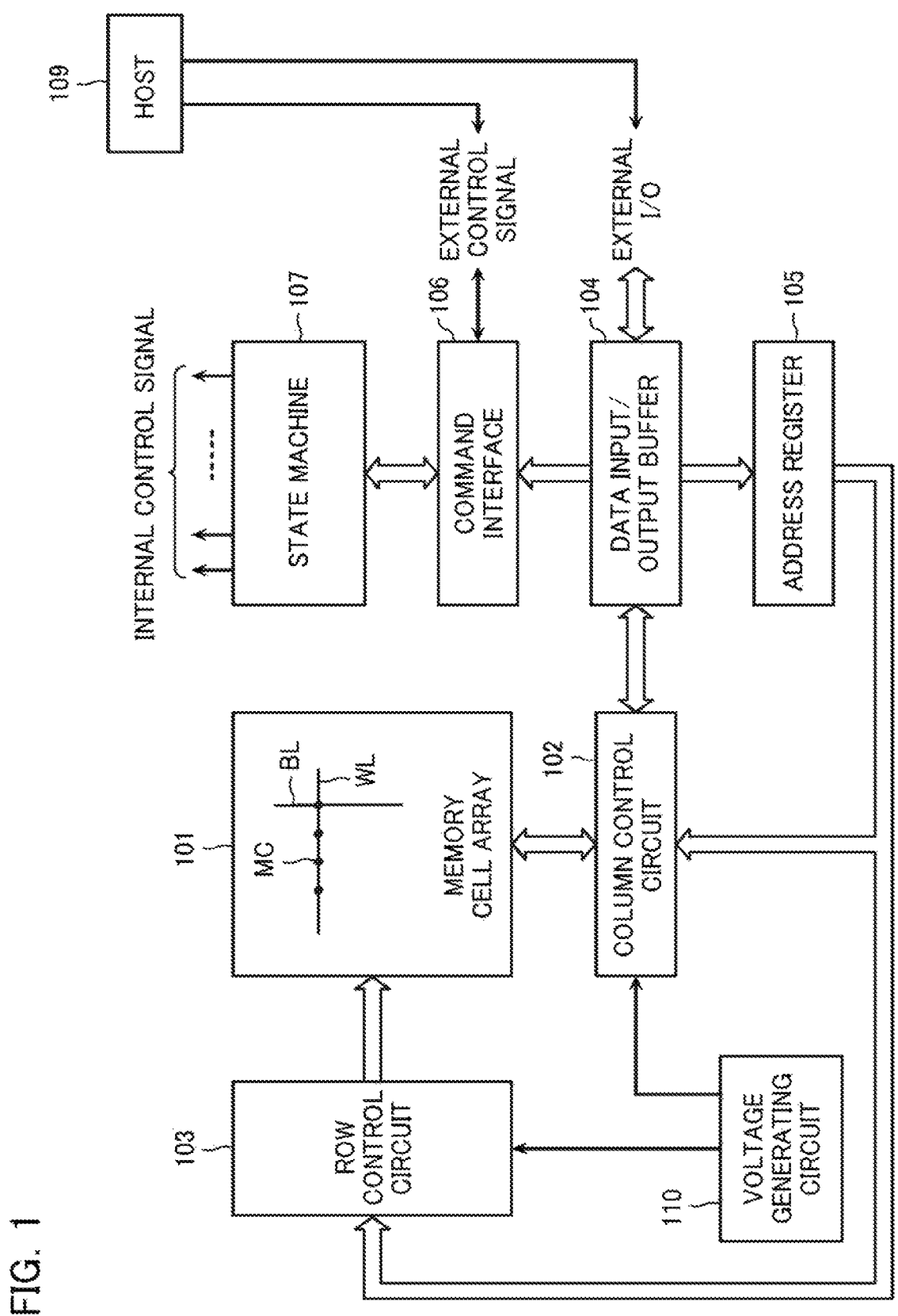
FIG. 1 is a block diagram of a non-volatile semiconductor memory device according to a first embodiment.

FIG. 1 is a block diagram of a non-volatile semiconductor memory device according to a first embodiment. The non-volatile semiconductor memory device includes a plurality of memory cells MC and a memory cell array 101. The memory cell array 101 includes bit lines BL and word lines WL connected to these memory cells MC. Around this memory cell array 101, a column control circuit 102 and a row control circuit 103 are disposed. The column control circuit 102 controls the bit lines BL to erase data in the memory cells MC, write data to the memory cells MC, and read data from the memory cells MC. The row control circuit 103 selects the word line WL to apply a voltage to erase data in the memory cells MC, write data to the memory cells MC, and read data from the memory cells MC.

A data input/output buffer 104 is connected to an external host 109 via an I/O line. The data input/output buffer 104 receives writing data, receives an erasure instruction, outputs reading data, and receives address data and command data. The data input/output buffer 104 transmits the received writing data to the column control circuit 102. The data input/output buffer 104 receives the data reading from the column control circuit 102 and outputs the data to the outside. The address data supplied from the outside to the data input/output buffer 104 is transmitted to the column control circuit 102 and the row control circuit 103 via an address register 105.

The command supplied from the host 109 to the data input/output buffer 104 is transmitted to a command interface 106. The command interface 106 receives an external control signal from the host 109. The command interface 106 determines whether the data input to the data input/output buffer 104 is the writing data, the command data, or the address data. If the input data is the command data, the command interface 106 transfers the data as a receiving command signal to a state machine 107.

The state machine 107 manages the entire non-volatile memory. The state machine 107 accepts the command data from the host 109 via the command interface 106 to manage, for example, reading, writing, erasing, and inputting/outputting the data.

The external host 109 also can receive status information managed by the state machine 107 and determine the operation result. This status information is also used to control the writing and the erasure.

The state machine 107 controls a voltage generating circuit 110. This control allows the voltage generating circuit 110 to output pulses at any given voltage and at any given timing.

Here, the formed pulses can be transferred to any given wiring selected by the column control circuit 102 and the row control circuit 103. These column control circuit 102, row control circuit 103, state machine 107, voltage generating circuit 110, or a similar component constitute the control circuit in the embodiment.

Figure 2:
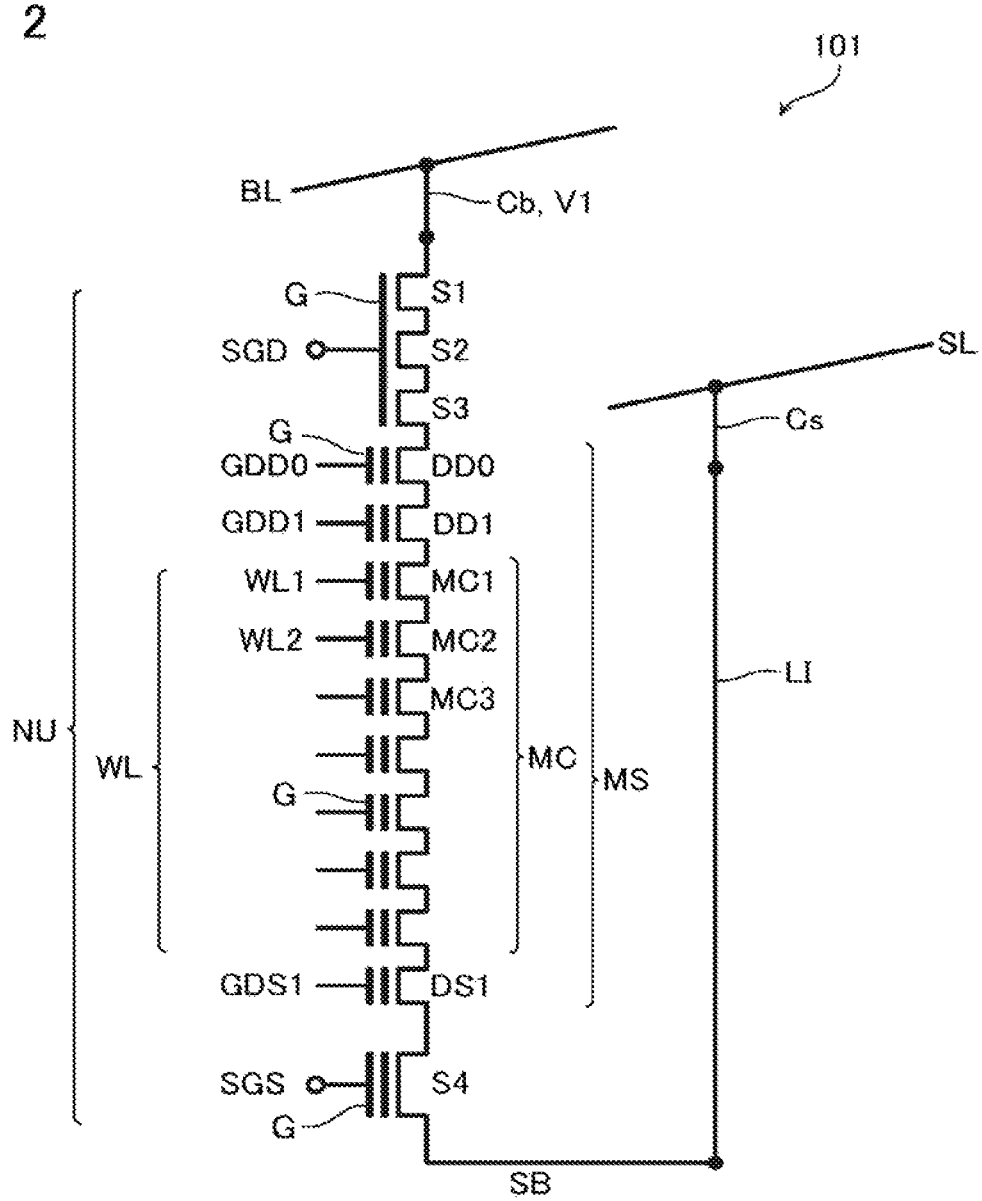
FIG. 2 is a circuit diagram showing a part of a configuration of the non-volatile semiconductor memory device.

FIG. 2 is a circuit diagram showing a part of a structure of the memory cell array 101. The memory cell array 101 according to the embodiment includes a plurality of memory cells MC (MC1, MC2, MC3 . . . ), which are connected in series, and a drain side dummy cell DD0, a dummy cell DD1, and a source side dummy cell DS1, which are connected to respective ends of these memory cells MC. These plurality of memory cells MC have control gate electrodes G connected to the respective word lines WL. The drain side dummy cell DD0, the dummy cell DD1, and the source side dummy cell DS1 have control gate electrodes G connected to dummy cell gate lines (GDD0, GDD1, and GDS1) respectively. These plurality of memory cells MC, dummy cell DD0, dummy cell DD1, and dummy cell DS1 configure a memory string MS.

The memory string MS has one end connected to the bit line BL via a drain side select gate transistor S1, a drain side select gate transistor S2, a drain side select gate transistor S3, a contact Cb, and a contact V1. The drain side select gate transistors S1, S2, and S3 include a common control gate electrode G. This control gate electrode G is connected to a drain side select gate line SGD.

The memory string MS has the other end electrically connected to a source contact LI via a source side select gate transistor S4 and a semiconductor substrate SB. The source contact LI is electrically connected to a source line SL via a contact Cs. The select gate transistor S4 has a control gate electrode G connected to a source side select gate line SGS.

These memory string MS and select gate transistors S1 to S4 configure a NAND cell unit NU.

The following describes a configuration of the memory cell array 101 with reference to FIG. 3 to FIG. 8.

Figure 3:
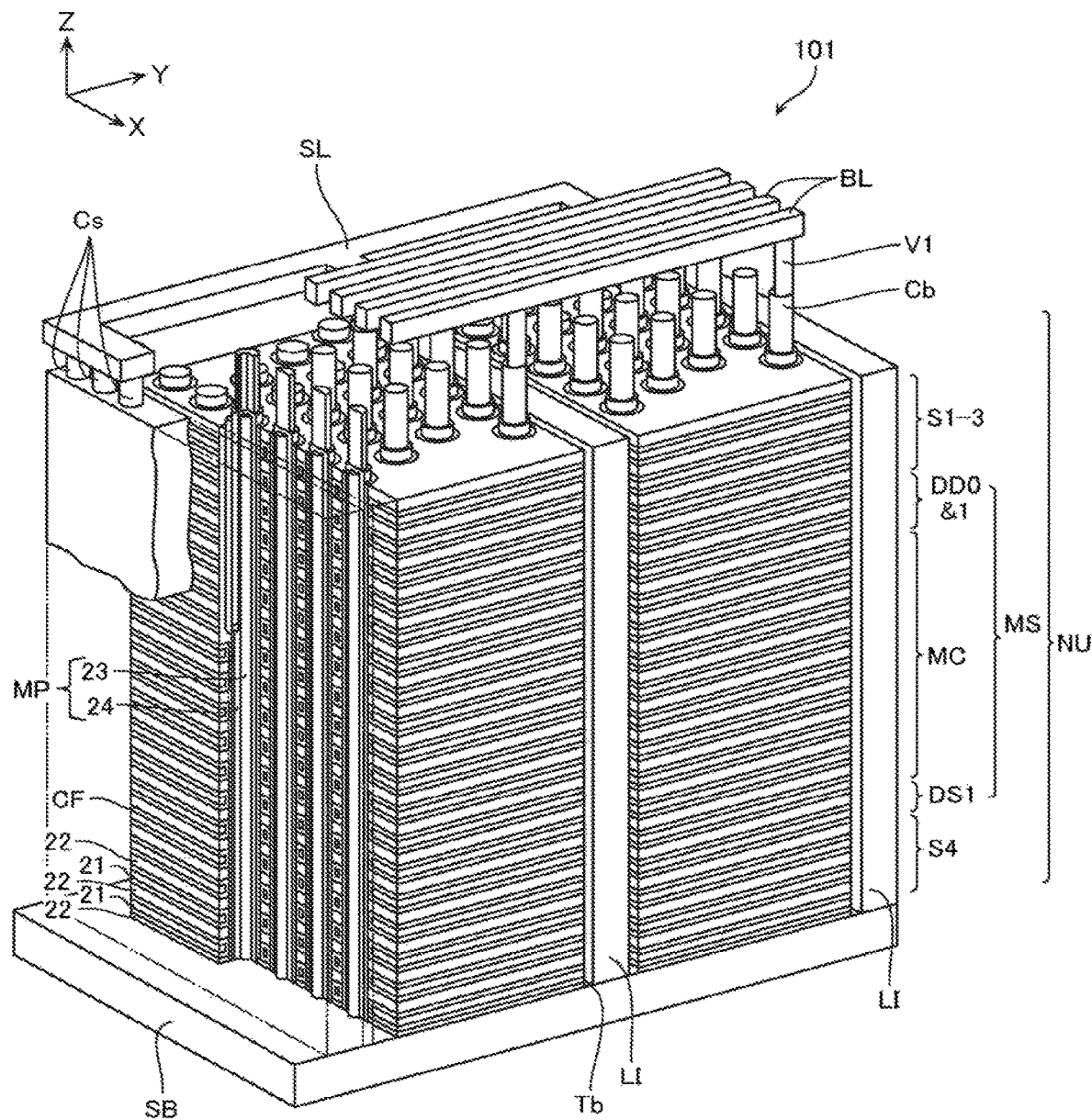
FIG. 3 is a perspective view showing a part of the configuration of the non-volatile semiconductor memory device.

FIG. 3 is a perspective view showing a part of the configuration of the memory cell array 101. The memory cell array 101 has a structure of laminated interlayer insulating layers 22 and conductive layers 21 in alternation on the semiconductor substrate SB. The conductive layer 21 is made of, for example, metal such as tungsten (W) and a conductive material such as polysilicon to which impurities are added. Around the conductive layer 21, a laminated film CF is formed. The interlayer insulating layer 22 is made of an insulating material such as silicon oxide ($SiO_2$).

The conductive layer 21 functions as the word line WL, the dummy cell gate line GDD0, the dummy cell gate line GDD1, the dummy cell gate line GDS1, the source side select gate line SGS, or the drain side select gate line SGD.

In FIG. 3, the conductive layer 21 extends in an X direction (the first direction) and a Y direction (the second direction), which are parallel to the semiconductor substrate SB. Penetrating a laminated body of the conductive layers 21 and the interlayer insulating layers 22, a memory pillar MP is disposed. The memory pillar MP includes a semiconductor layer 23 and a memory layer 24. The semiconductor layer 23 is made of, for example, polysilicon. The semiconductor layer 23 is a channel body of the NAND cell unit NU. The semiconductor layer 23 having longitudinally a Z direction (the third direction) intersecting with the semiconductor substrate SB is opposed to the control gate electrode G (not shown in FIG. 3). The semiconductor layers 23 have an upper end connected to the bit line BL via the contact Cb and the contact V1. The bit lines BL having longitudinally the Y direction are arranged at a certain pitch along the X direction. The semiconductor layer 23 has a lower end connected to the semiconductor substrate SB.

Between the semiconductor layer 23 and the conductive layer 21 (the control gate electrode G), the memory layer 24 is arranged. The memory layer 24, as described later, is a gate insulating layer including a charge accumulation layer. The laminated body of the conductive layers 21 and the interlayer insulating layers 22 is separated in the Y direction by a trench Tb. The trench Tb has a sidewall where the source contact LI is disposed via an interlayer insulating layer LII. This source contact LI is a plate-shaped conductive body extending in the X direction and the Z direction. The source contact LI has a lower surface connected to the semiconductor substrate SB. The source contact LI has a top surface connected to the source line SL via the contact Cs.

Figure 4:
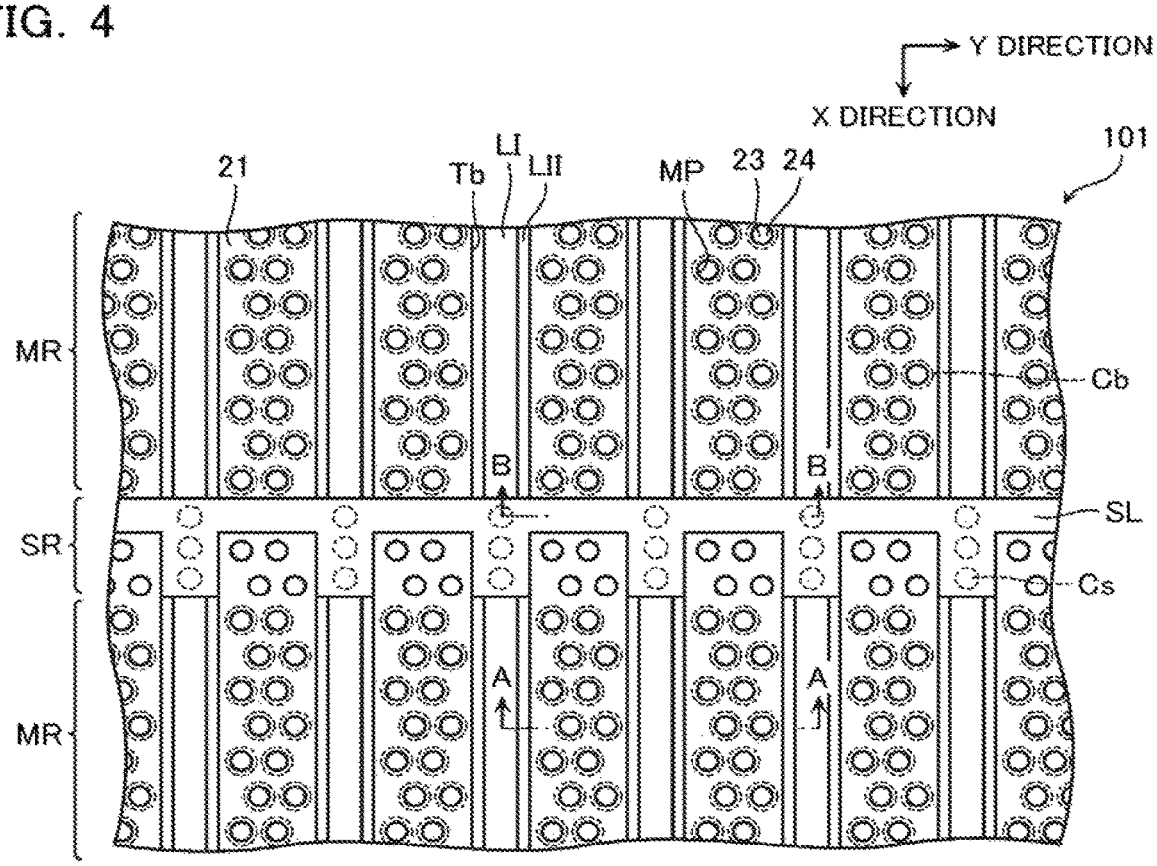
FIG. 4 is a plan view showing a part of the configuration of the non-volatile semiconductor memory device.

FIG. 4 is a plan view showing a part of the configuration of the memory cell array 101. The conductive layer 21 and the source contact LI, on an X-Y plane, are divided into a memory region MR (a first region) and a source contact region SR (a second region), which are adjacent in the X direction. The memory pillars MP are, as one example, arranged in a staggered pattern at a certain pitch on the X-Y plane. The memory pillar MP may have an arrangement being a triangular arrangement or a square arrangement other than the staggered pattern.

The memory region MR includes the plurality of contacts Cb that connects the semiconductor layer 23 to the bit line BL. The contact Cb is not disposed at the source contact region SR.

The source contact LI has a side surface, where the interlayer insulating layers LII are disposed, and a top surface, which is connected to the source line SL via the contact Cs at the source contact region SR. The contact Cs is not disposed at the memory region MR.

Figure 5:
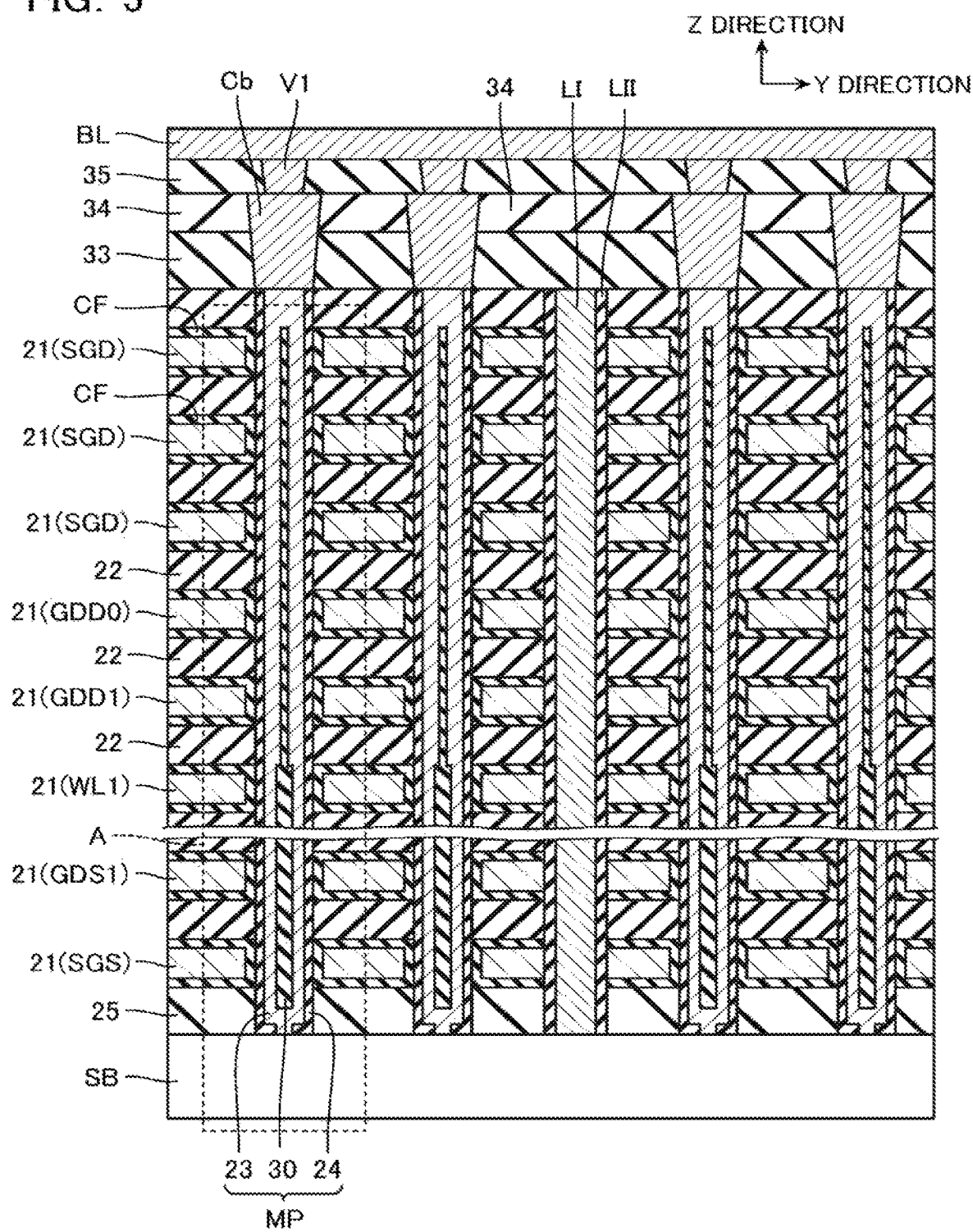
FIG. 5 is a cross-sectional view showing a part of the configuration of the non-volatile semiconductor memory device.

FIG. 5 is a cross-sectional view showing a part of the configuration of the memory cell array 101. FIG. 5 shows across section of a part indicated in a line A-A in FIG. 4.

The conductive layers 21 and the interlayer insulating layers 22 are laminated in alternation above the semiconductor substrate SB via an insulating layer 25. The laminated film CF preventing impurity diffusion from the conductive layer 21 covers around the conductive layer 21. The memory pillar MP is disposed to penetrate the laminated body of these conductive layers 21 and interlayer insulating layers 22. The memory pillar MP having longitudinally the Z direction is opposed to the plurality of conductive layers 21 laminated above the semiconductor substrate SB. The conductive layers 21 are the control gates of the plurality of memory cells MC, the dummy cells DD0, DD1, and DS1, which are connected to the memory cells MC in series, or the select gate transistors S1 to S4, which are connected to these dummy cells in series. The reference numerals in parenthesis written with the reference numerals 21 in FIG. 5 represent roles of the gates that the conductive layers 21 perform (corresponding to FIG. 2).

The memory pillar MP includes, in an order from the center of this radial direction, a core insulating layer 30, the semiconductor layer 23, and the memory layer 24 having longitudinal directions in the Z direction.

In FIG. 5, the core insulating layer 30 has a diameter that differs depending on a position in the Z direction. In view of this, the semiconductor layer 23, which acts as the channel body, has a width (a thickness) in the X direction or the Y direction that also differs depending on a position in the Z direction. The diameter of the core insulating layer 30 positioned at an upper layer word line WL1, and the diameter of the core insulating layer 30 positioned at a substrate SB side of the word line WL1 are larger than the diameters of the core insulating layer 30 positioned at the dummy cell gate line (GDD1) and positioned higher than the dummy cell gate line GDD1. In inverse, the width (the thickness) of the semiconductor layer 23 acting as the channel body is wider in the X direction or the Y direction at a position higher than the uppermost layer word line WL, and narrower in a lower side.

The memory pillar MP has an upper end electrically connected to the bit line BL via the contact Cb and the contact V1. The memory pillar MP has the other end electrically connected to the semiconductor substrate SB.

The contact Cb, the contact V1, and the bit line BL are electrically insulated one another by an insulating layer 33, an insulating layer 34, and an insulating layer 35 to be arranged at a certain pitch in the X direction. The source contact LI in the center of FIG. 5 is made of tungsten (W) in the embodiment. The source contact LI is electrically insulated from the conductive layer 21 (WL) by the interlayer insulating layer LII. The source contact LI has a lower end electrically connected to the semiconductor layer 23 in the memory pillar MP via the semiconductor substrate SB.

Figure 6:
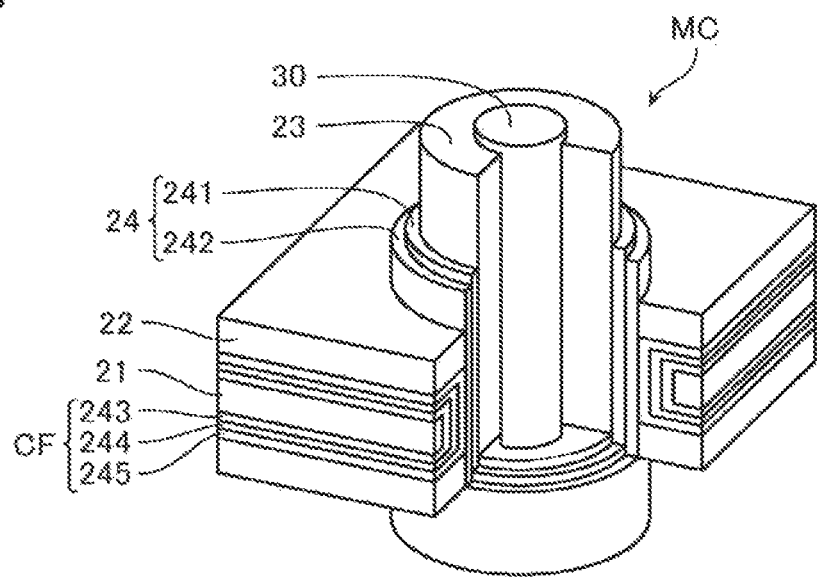
FIG. 6 is a perspective view showing a part of the configuration of the non-volatile semiconductor memory device.

FIG. 6 is a perspective view indicating a part of the configuration of the memory cell MC in detail. Around the core insulating layer 30, the semiconductor layer 23 is formed. Further, outside of the semiconductor layer 23, the memory layer including a tunnel insulating layer 241 and a charge accumulation layer 242 is formed. The memory layer 24 is opposed to the conductive layer 21 via the laminated film CF. This conductive layer 21 acts as the word line WL. The laminated film CF includes a barrier metal 245, a high-dielectric film 244, and a block insulating layer 243, which are disposed in an order from a side surface side of the memory layer 24. Accordingly, the semiconductor layer 23 is opposed to the conductive layer 21 (the word line WL) via the tunnel insulating layer 241, the charge accumulation layer 242, and the laminated film CF (the barrier metal 245, the high-dielectric film 244, and the block insulating layer 243). The conductive layer 21 is insulated in the Z direction by the interlayer insulating layer 22.

The semiconductor layer 23 is made of, for example, polysilicon. The charge accumulation layer 242 is made of, for example, silicon nitride (SiN). The tunnel insulating layer 241 is made of silicon oxide ($SiO_2$). The core insulating layer 30 is made of, for example, silicon oxide ($SiO_2$).

The block high-dielectric film 244 is made of, for example, metal oxide such as alumina ($Al_2O_3$) or hafnium oxide ($HfO_x$). The barrier metal 245 is made of, for example, metal nitride such as TiN, WN, or TaN. The interlayer insulating layer 22 is made of, for example, silicon oxide ($SiO_2$).

Figure 7:
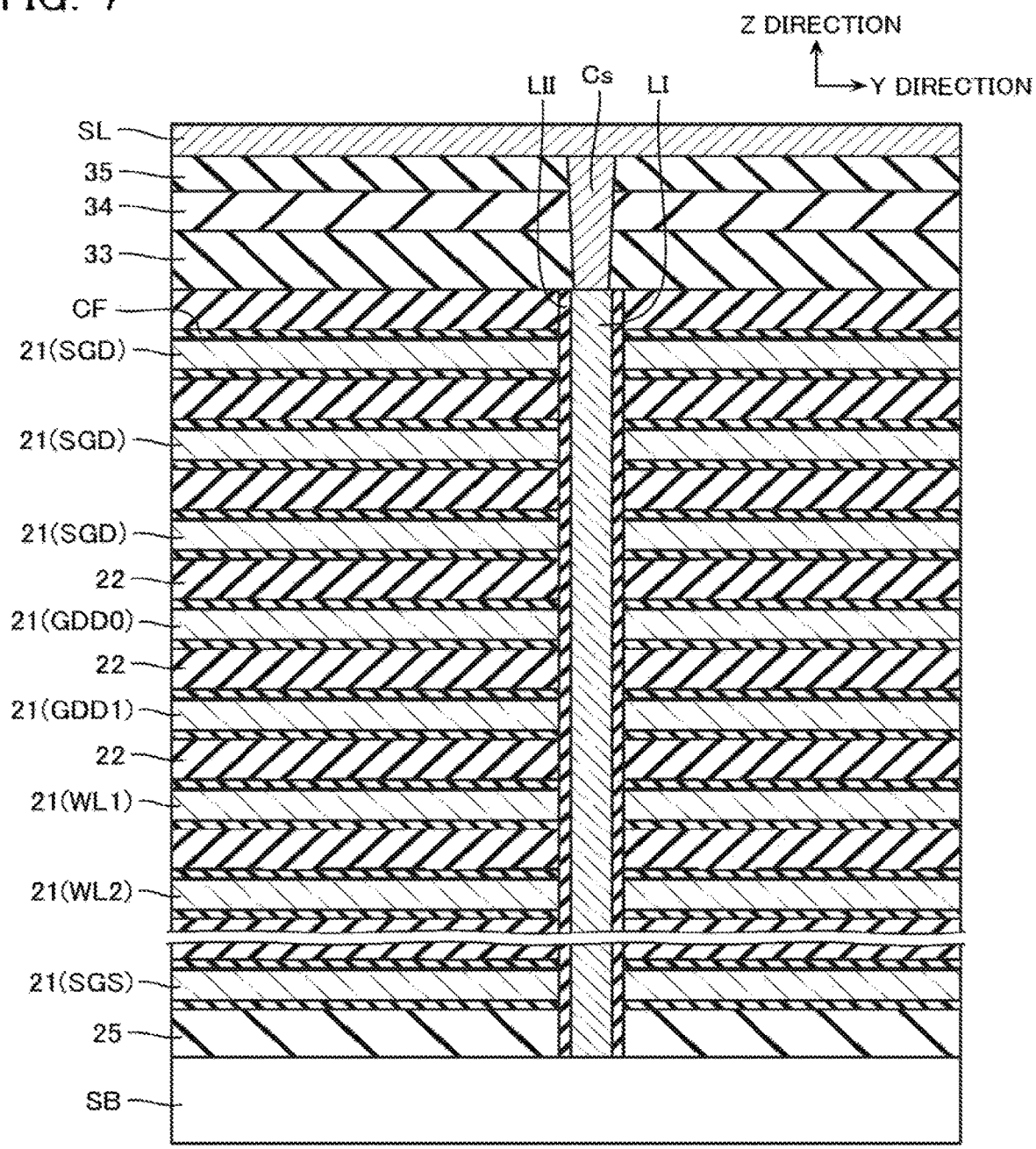
FIG. 7 is a cross-sectional view showing a part of the configuration of the non-volatile semiconductor memory device.

FIG. 7 is a cross-sectional view at a position indicated in a line B-B in FIG. 4. The source contact LI is electrically connected to the source line SL via the contact Cs. The source contact LI is insulated from the conductive layer 21 by the interlayer insulating layer LII.

Figure 8:
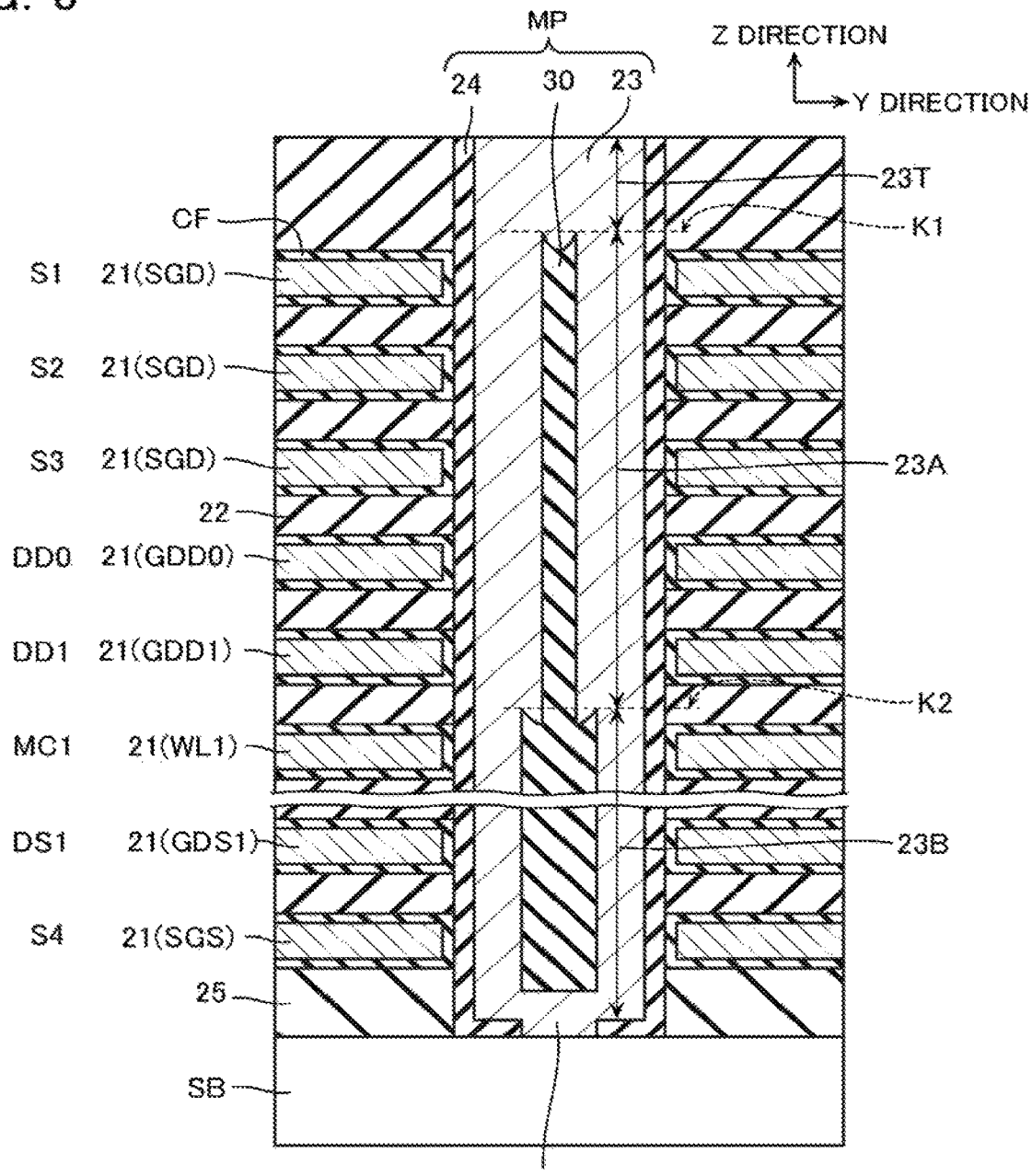
FIG. 8 is a cross-sectional view showing a part of the configuration of the non-volatile semiconductor memory device.

FIG. 8 is a Y-Z cross-sectional view that enlarges a part A represented as a rectangular in a dotted line in FIG. 5 to describe a structure of the memory pillar MP. In FIG. 8, the reference numerals in parentheses written with the reference numerals 21 represent the roles of the gates that the conductive layers 21 perform, and the reference numerals written at left sides of the reference numerals 21 represent kind of elements (corresponding to FIG. 2). The memory pillar MP has a configuration such that the semiconductor layer 23 surrounds the center core insulating layer 30, and further the memory layer 24 including the charge accumulation layer surrounds an outside of the semiconductor layer 23. Both memory pillar MP and conductive layer 21 configure the NAND cell unit NU. The semiconductor layer 23 has a bottom portion 23C connected to the semiconductor substrate SB. The semiconductor layer 23 has an upper portion 23T (above a border K1) connected to the bit line BL side.

As shown in FIG. 8, the core insulating layer 30 has a columnar-shape in which width in the X direction or the Y direction differs above and below a border K2. The diameter of the core insulating layer 30 on the near side of the semiconductor substrate SB with respect to the border K2 is thicker than the diameter of the core insulating layer 30 on the far side of the semiconductor substrate SB with respect to the border K2. Thus, the semiconductor layer 23, using the border K2 as a border, in the Z direction, has a semiconductor layer region 23A (a first portion) on the far side of the semiconductor substrate SB and a semiconductor layer region 23B (a second portion) on the closer side of the semiconductor substrate SB. The semiconductor layer region 23A has a width in the X direction or the Y direction larger than a width in the X direction or the Y direction of the semiconductor layer region 23B. The border K2 has a position, in an example of the drawing, set to a position between the uppermost layer word line WL1 and the dummy word line GDD1. However, the position of the border K2 is not limited to this, and may be at any position at a closer side to the bit line BL the uppermost layer word line WL1.

Here, the semiconductor layer region 23A is a region to be a channel body of the select gate transistors S1 to S3 and the dummy cells DD0 to DD1. The semiconductor layer region 23B is a region to be a channel body of the memory cell MC, the dummy cell DS1, and the select gate transistor S4.

Thus, the memory pillar MP of the embodiment has a thickness of the channel body that differs depending on elements included in the memory pillar MP. An effect by thus providing the difference to the thickness of the channel body will be described with reference to FIG. 9.

Figure 9:
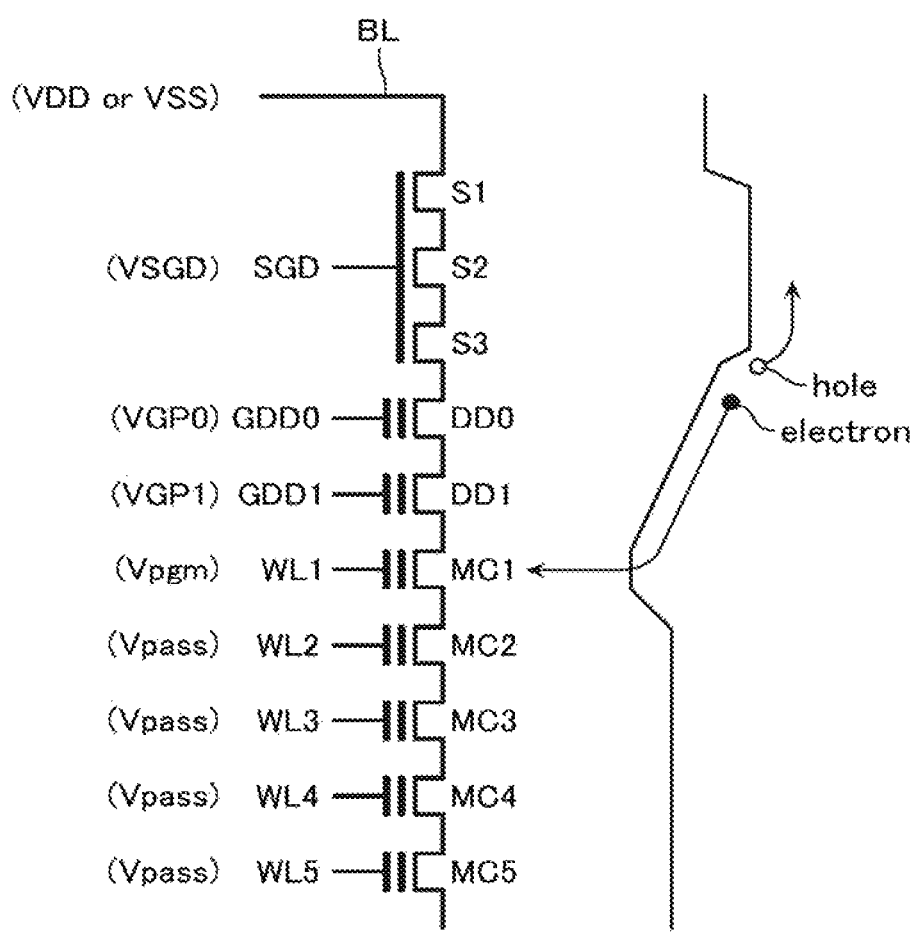
FIG. 9 is a conceptual diagram to describe a phenomenon that may occur in an operation of a non-volatile semiconductor memory device.
Figure 32:
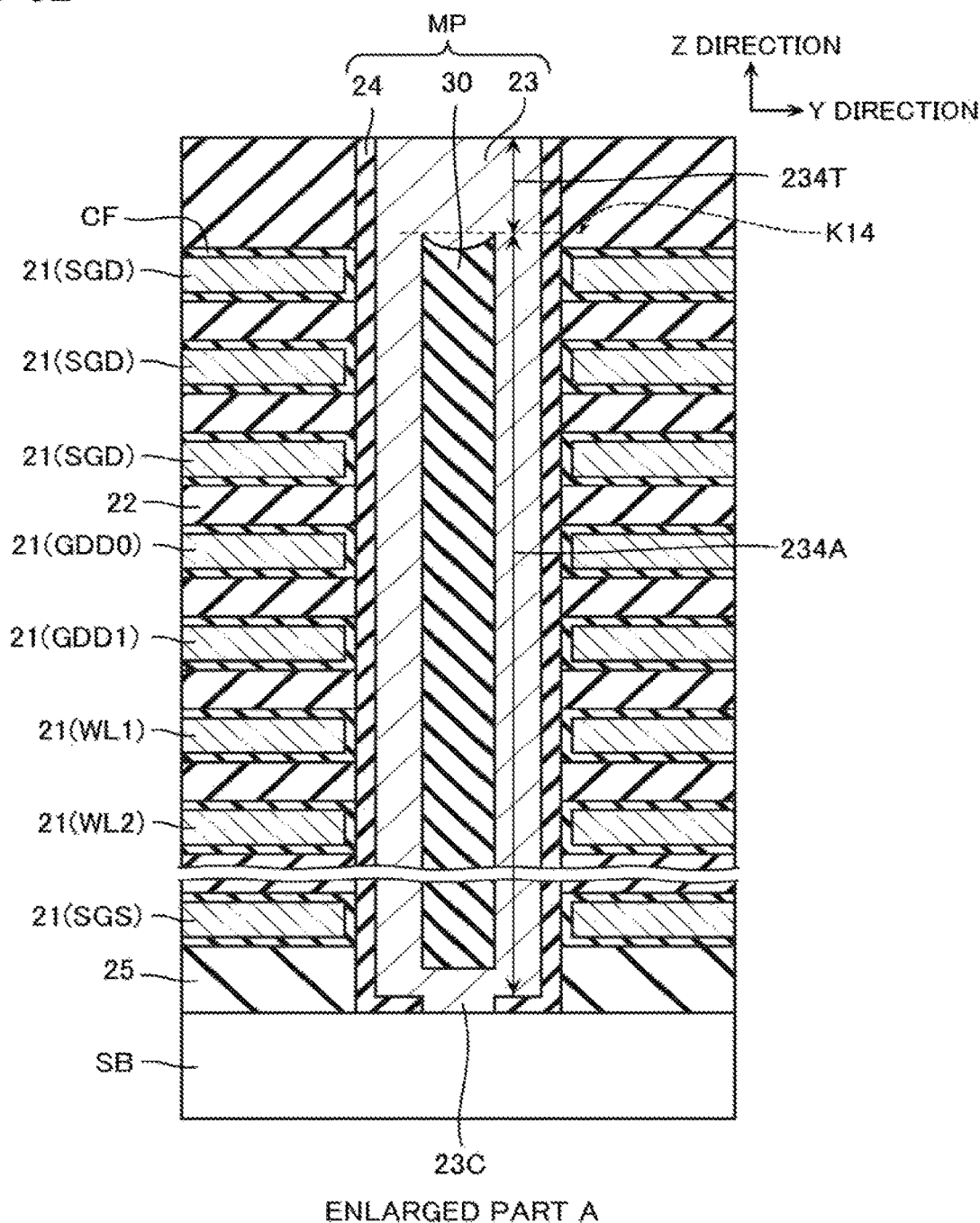
FIG. 32 is a cross-sectional view showing a part of a configuration of a non-volatile semiconductor memory device in a comparative example.

As shown in a comparative example in FIG. 32, when the thickness of the channel body is approximately identical in the entire memory pillar MP, a problem described below may occur in a writing operation of the semiconductor memory device. FIG. 9, at this left side, shows an equivalent circuit diagram of a part of the bit line side of the NAND cell unit NU, and at this right side, schematically shows potential distribution of the semiconductor layer 23 at a non-selected NAND cell unit NU.

In the writing operation, for example, to the selected word line WL1 connected to the selected memory cell MC1, a program voltage Vpgm (for example, 20 V or more) is applied. On the other hand, to a non-selected word line WL, a writing path voltage Vpass (for example, around 8 to 10 V) having a magnitude to the extent where writing does not occur is applied. On the other hand, a voltage VSGD applied to the drain side select gate line SGD is set to 0 V. Voltages VGP0 and VGP1 applied to the control gates of the dummy cells DD0 and DD1 are set to, for example, a voltage to the extent conducting the dummy cells DD0 and DD1 respectively.

In such a voltage applied state, the drain side select gate transistors S1 to S3 are in a non-conductive state, and thus, the semiconductor layer 23 is in a floating state. In view of this, a potential of the semiconductor layer 23 near a non-selected memory cell is boosted to a certain boost potential by applying the writing path voltage Vpass (a value of the boost potential differs according to a writing state (held data) of the memory cell in the NAND cell unit NU). On the other hand, a potential of the semiconductor layer 23 near the selected memory cell MC1, by the program voltage Vpgm, is boosted to a potential further higher than the potential of the semiconductor layer 23 near the non-selected memory cell.

On the other hand, a potential of the semiconductor layer 23 near the drain side select gate transistors S1 to S3 is not boosted because an applied voltage of the select gate line SGD is 0 V.

Thus, in the writing operation, inside the semiconductor layer 23 of the non-selected NAND cell unit NU, in particular, near the drain side select gate transistors S1 to S3, large potential difference occurs. This potential difference makes, what is called, GIDL current to flow, and then the holes generated by this moves to the bit line BL side, while the electrons move to a direction of the memory cell. There is a problem that this increases a concern of erroneous writing.

Therefore, the embodiment solves this problem by adopting the above-described structures of the core insulating layer 30 and the semiconductor layer 23. That is, as shown in FIG. 8, making the width in the X direction or the Y direction of the semiconductor layer region 23A larger than the width in the X direction or the Y direction of the semiconductor layer region 23B can prevent the large potential difference (potential gradient) from occurring in the semiconductor layer 23 of an end portion of the above-described NAND cell unit NU. As the result, this can suppress injection of the electrons based on the GIDL current to the memory cell MC, thus reducing the concern of erroneous writing.

Method of Manufacturing

Figure 10:
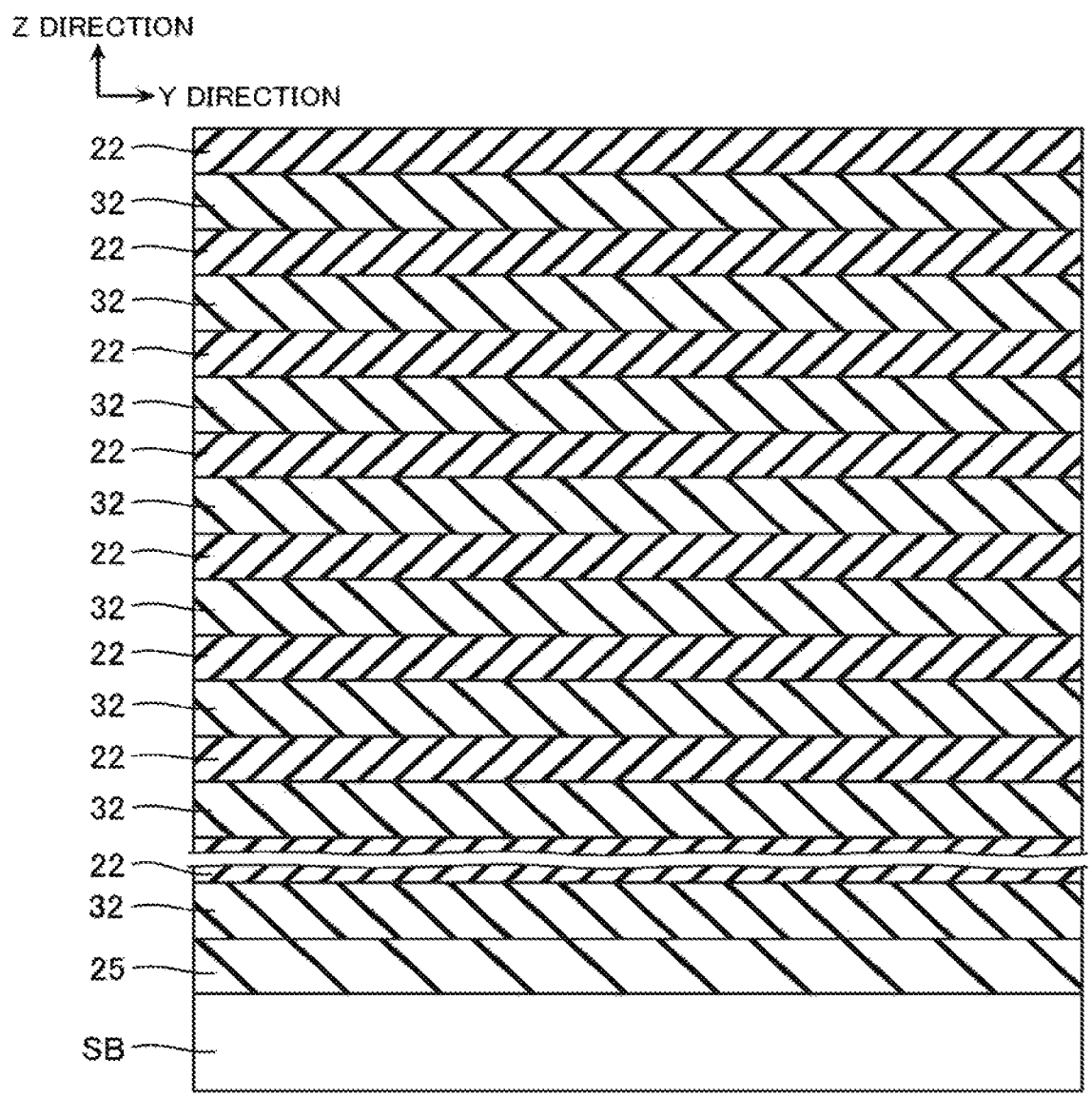
FIG. 10 is a cross-sectional view showing a manufacturing process of the non-volatile semiconductor memory device.

FIG. 10 to FIG. 26 are cross-sectional views for describing a method of manufacturing according to the first embodiment. At a process shown in FIG. 10, the insulating layer 25 is laminated on the semiconductor substrate SB. Furthermore, a plurality of sacrificial layers 32 and the interlayer insulating layers 22 are laminated in alternation above the insulating layer 25. The insulating layer 25 and the interlayer insulating layer 22 are made of, for example, silicon oxide ($SiO_2$). The sacrificial layer 32 is made of, for example, silicon nitride (SiN).

Figure 11:
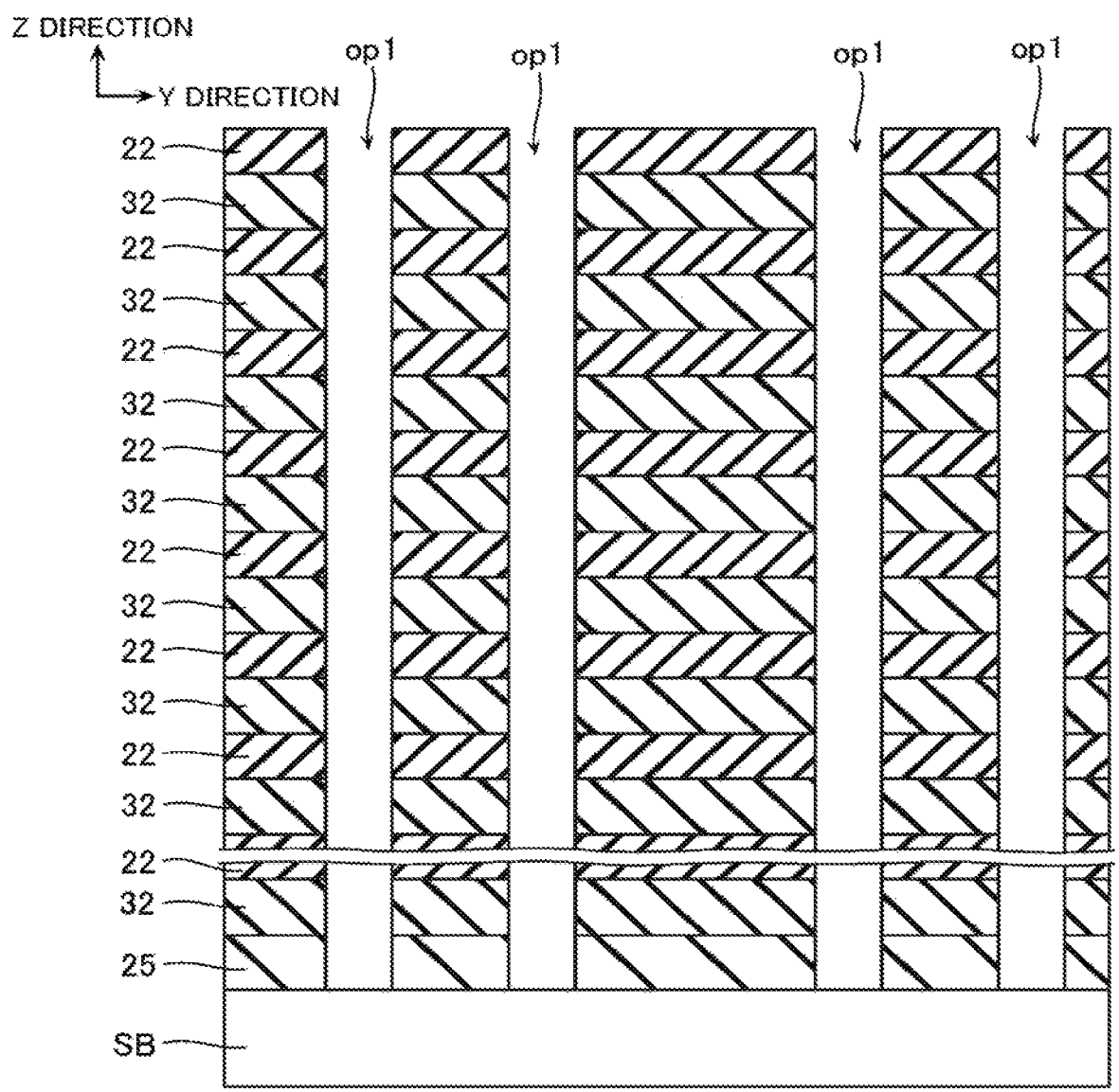
FIG. 11 is a cross-sectional view showing a manufacturing process of the non-volatile semiconductor memory device.

Next, at a process shown in FIG. 11, as openings for forming, for example, the memory pillar MP, openings op1 penetrating the insulating layer 25, the sacrificial layers 32, and the interlayer insulating layers 22 are formed. This opening op1 is formed at the memory region MR, and is not formed at the source contact region SR in FIG. 4.

Figure 12:
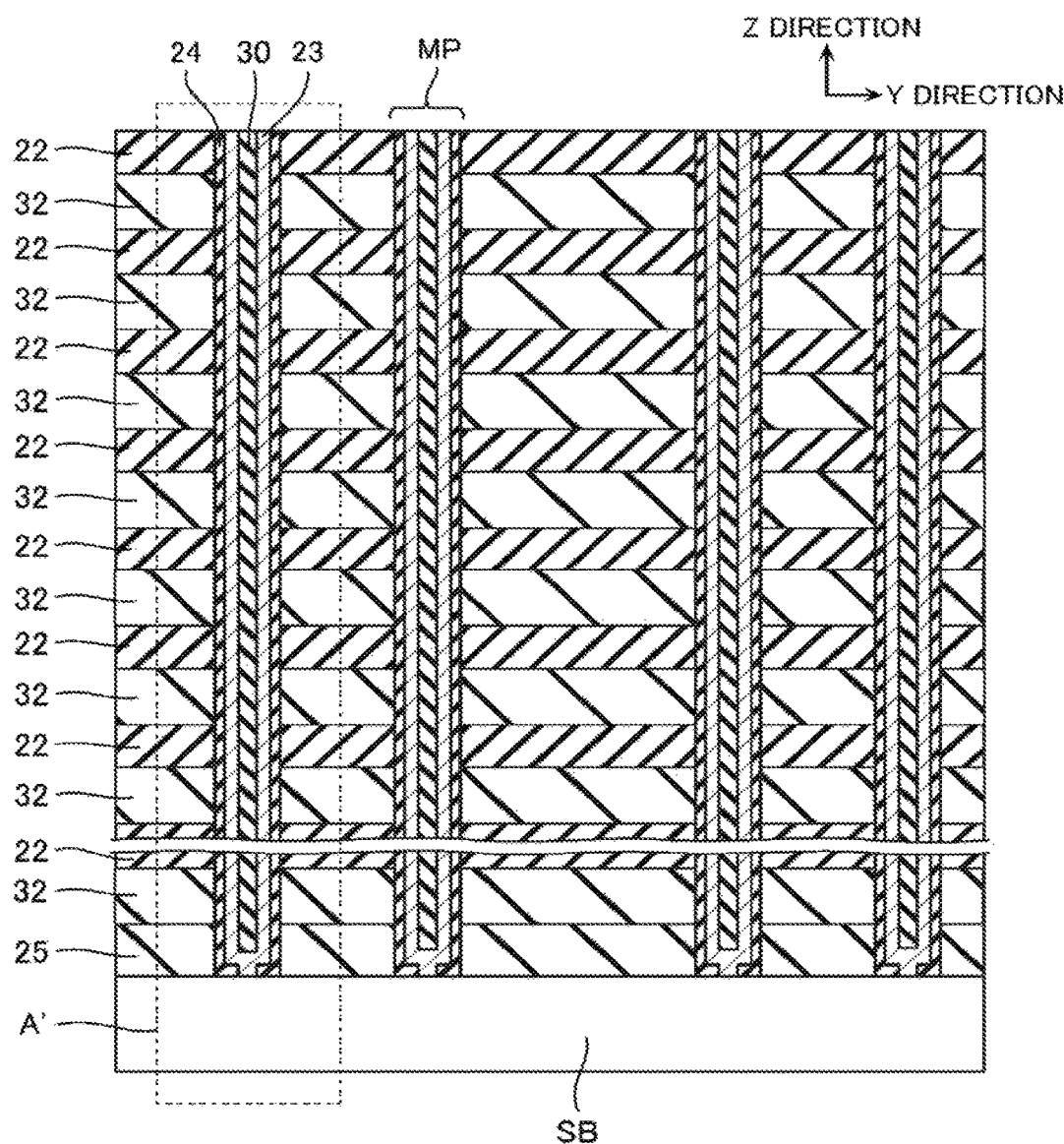
FIG. 12 is a cross-sectional view showing a manufacturing process of the non-volatile semiconductor memory device.

Subsequently, at a process shown in FIG. 12, inside the opening op1, the memory layer 24, the semiconductor layer 23, and the core insulating layer 30 are formed by, for example, a CVD method to form the memory pillar MP. Although specific illustration is omitted in FIG. 12, first, silicon nitride and silicon oxide that will be the charge accumulation layer 242 and the tunnel insulating layer 241 configuring the memory layer 24 are formed on a side surface and a bottom surface of the opening op1. Then, the charge accumulation layer 242 and the tunnel insulating layer 241, which are formed in the opening op1, are removed by etching to expose apart of the semiconductor substrate SB.

Next, along an inner wall of the opening op1, the semiconductor layer 23 made of amorphous silicon is formed. Amorphous silicon is transformed into polysilicon by heat treatment. This semiconductor layer 23 is also formed on the semiconductor substrate SB exposed in the opening op1. Then, this semiconductor layer 23 has a side surface where, for example, silicon oxide that will be the core insulating layer 30 is formed. This forms the memory pillar MP shown in FIG. 12.

Figure 13:
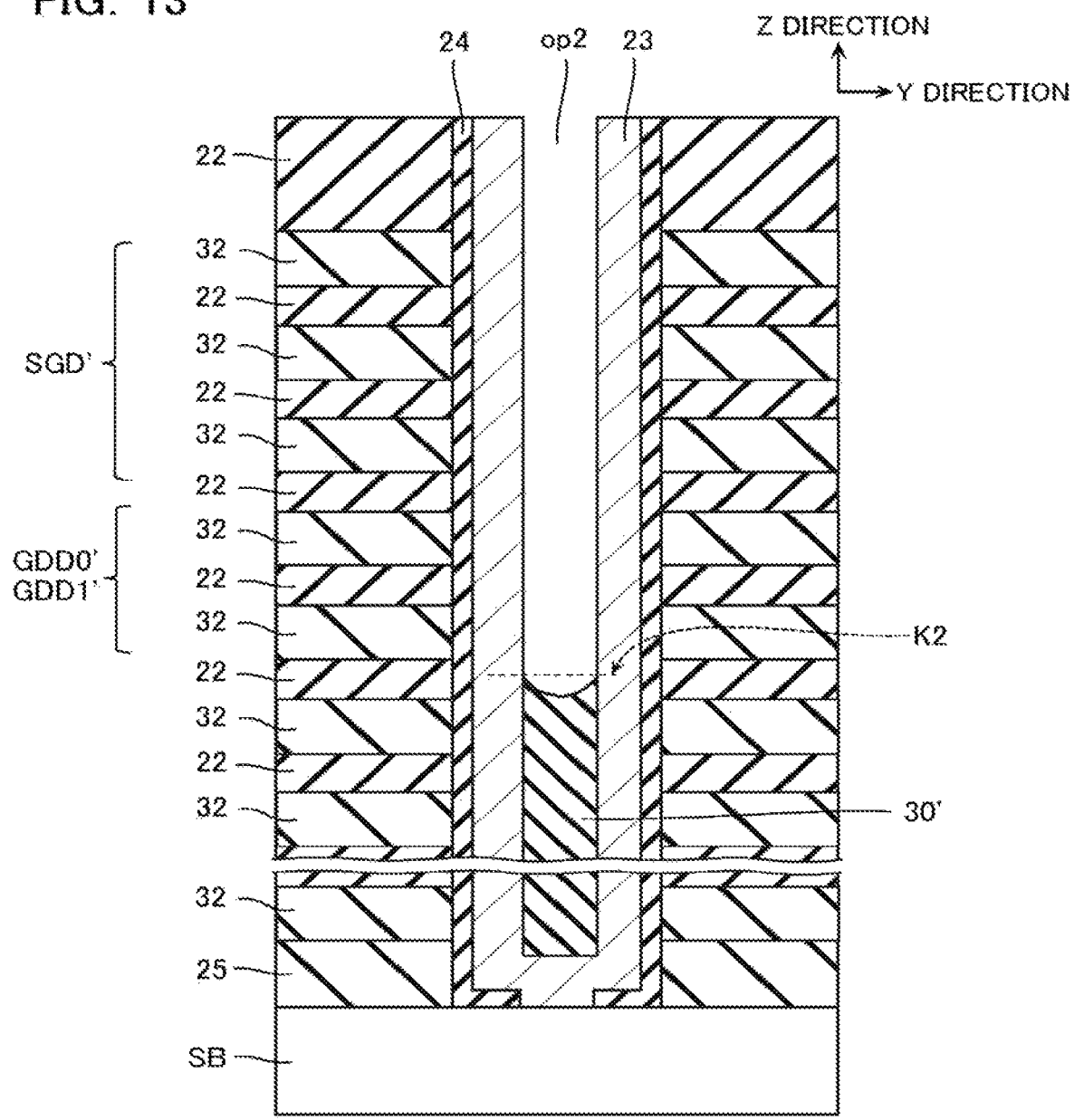
FIG. 13 is a cross-sectional view showing a manufacturing process of the non-volatile semiconductor memory device.

Then, as shown in FIG. 13, an upper portion of the filled core insulating layer 30 is dug down by etching to the border K2 (corresponding to K2 in FIG. 8) to forma second opening op2. FIG. 13 is an enlarged cross-sectional view of a part of a rectangular A' (dotted line) in FIG. 12. Reference numerals SGD', GDD0', GDD1', and WL' at the left side of the drawing represent roles of the conductive layers 21 where the sacrificial layer 32 is to be replaced at a later process. The border K2 where a core insulating layer 30' is dug down, in an example in FIG. 13, is positioned at the proximity of a border between the dummy cell gate line GDD1' and the word line WL1'. However, this is merely one example and not limited to this example.

Figure 14:
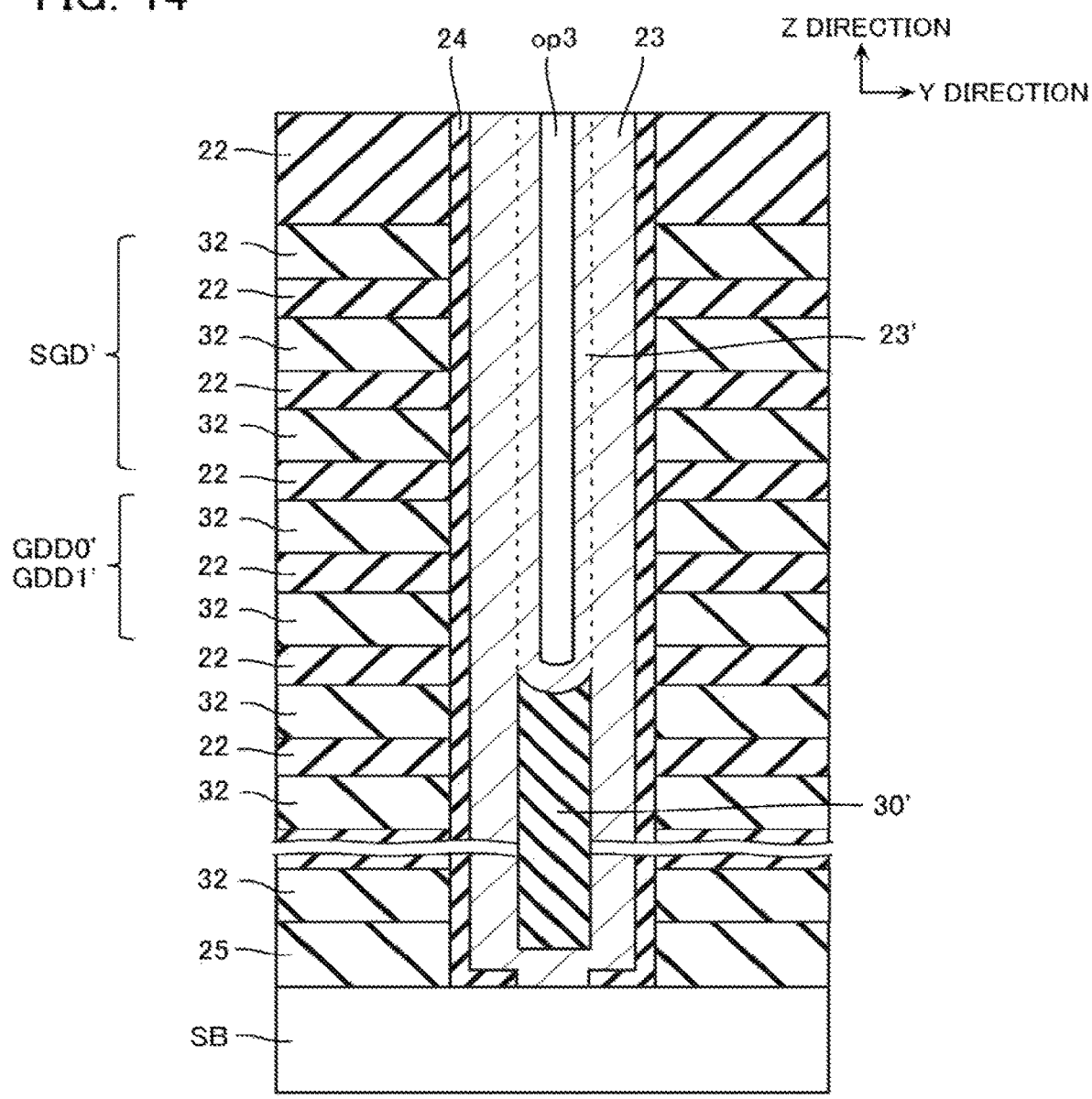
FIG. 14 is a cross-sectional view showing a manufacturing process of the non-volatile semiconductor memory device.

Next, at a process shown in FIG. 14, a semiconductor layer 23' made of amorphous silicon is formed along an inner wall of the opening op2. Thus, the opening op2 is partially embedded by the semiconductor layer 23' to form a third opening op3, a width of which is smaller than a width of the opening op2. The opening op3 has a width in the X direction or the Y direction smaller than a width in the X direction or the Y direction of the core insulating layer 30' positioned below the opening op3. The semiconductor layer 23' is thereafter transformed into polysilicon by applying a thermal process to constitute a part of the semiconductor layer 23. Since the semiconductor layer 23' is isotropically formed, the semiconductor layer 23' is also formed on an upper portion of the core insulating layer 30'.

Figure 15:
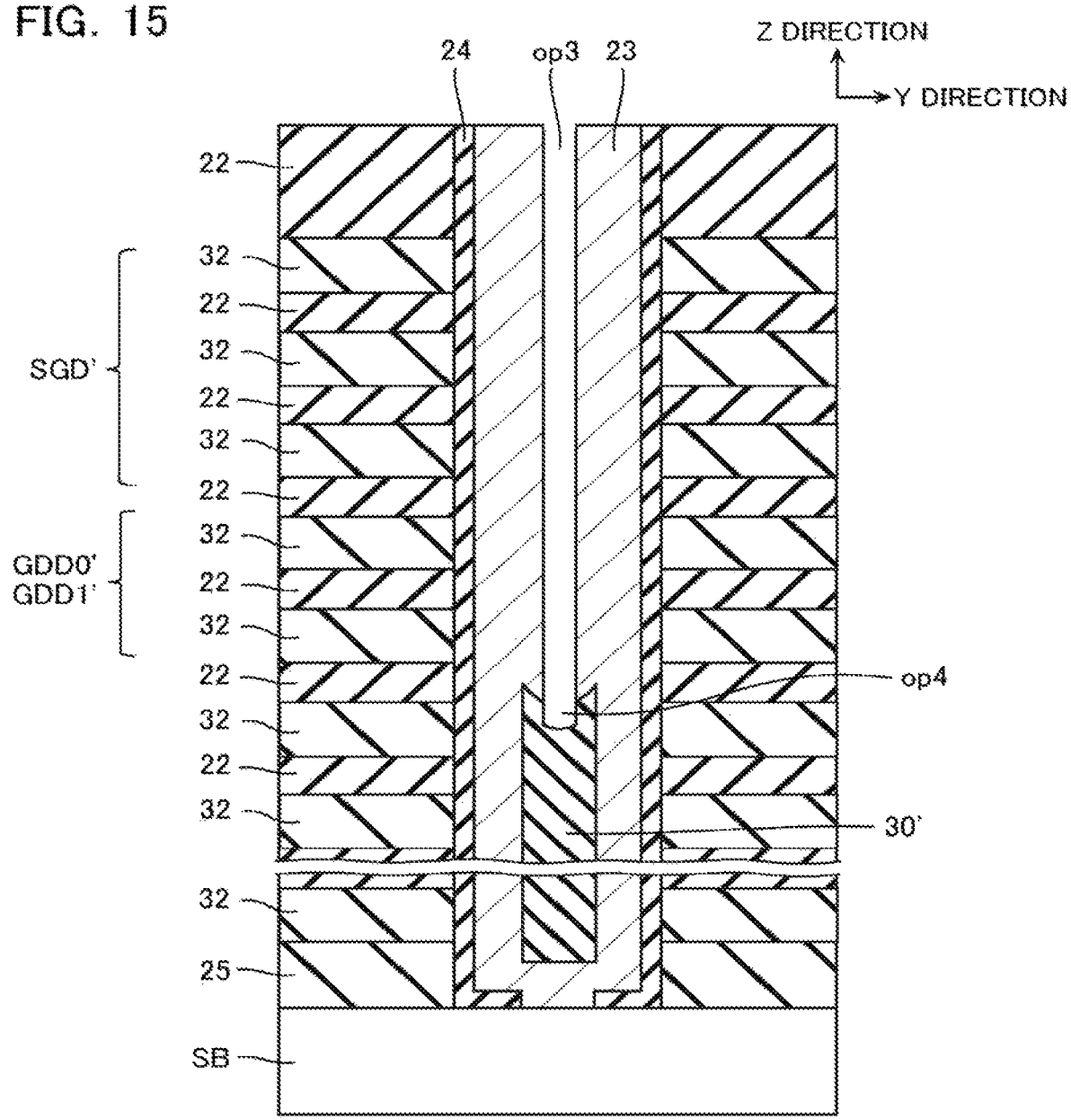
FIG. 15 is a cross-sectional view showing a manufacturing process of the non-volatile semiconductor memory device.

Next, at a process shown in FIG. 15, using anisotropic etching such as RIE (Reactive Ion Etching), the semiconductor layer 23' is dug down. At this time, not only the semiconductor layer 23' but also the upper portion of the core insulating layer 30' is removed by etching to form a fourth opening op4, which is continuous with the third opening op3.

Subsequently, at a process shown in FIG. 16, the third opening op3 and the fourth opening op4, which is continuous with the third opening op3, are embedded with, for example, silicon oxide ($SiO_2$) to form a core insulating layer 30". This core insulating layer 30" and the remaining core insulating layer 30' are integrated to form the above-mentioned core insulating layer 30.

Figure 17:
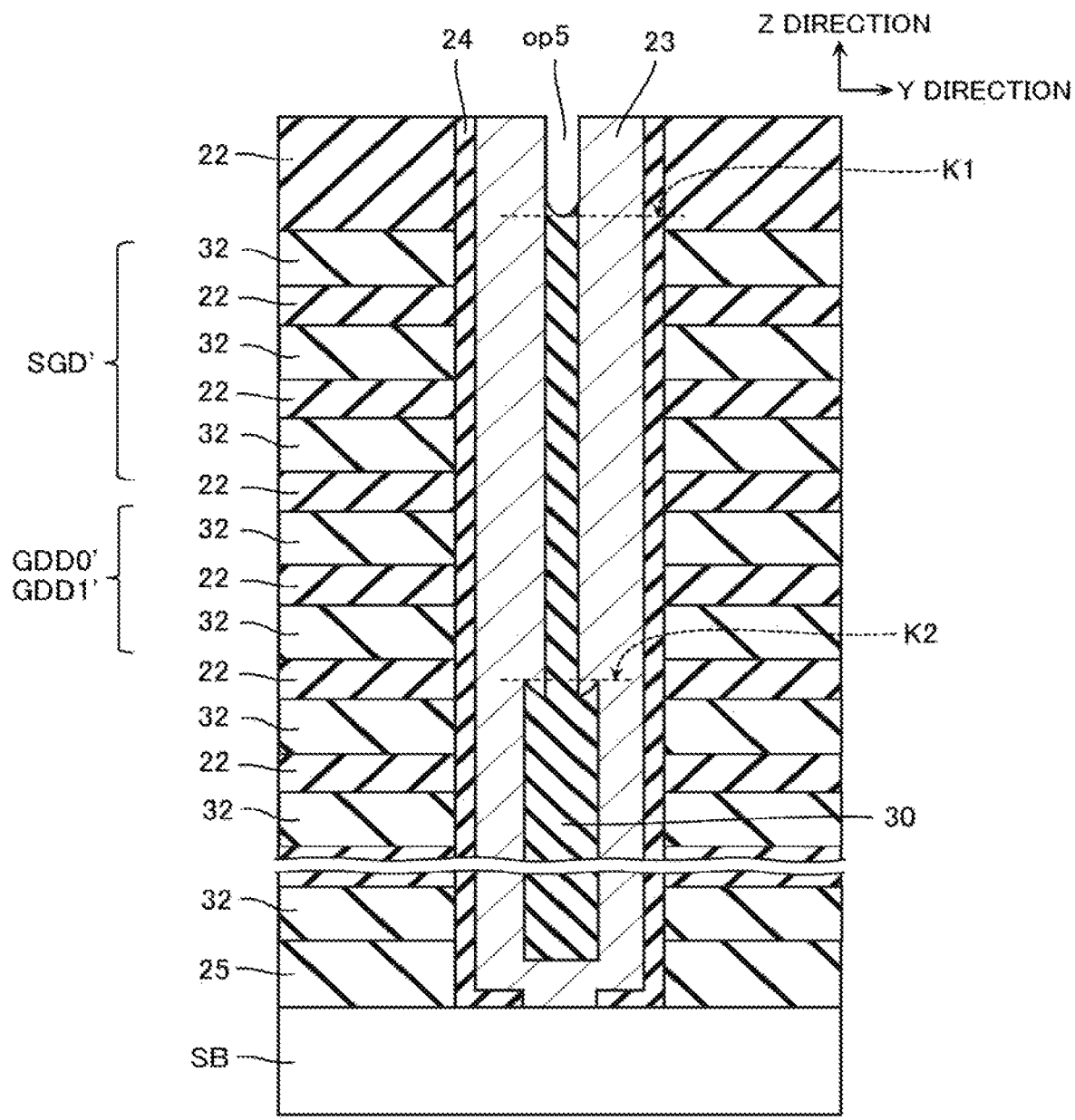
FIG. 17 is a cross-sectional view showing a manufacturing process of the non-volatile semiconductor memory device.

Next, at a process shown in FIG. 17, an upper portion of the core insulating layer 30 is dug down by etching to the border K1 to form a fifth opening op5.

Figure 18:
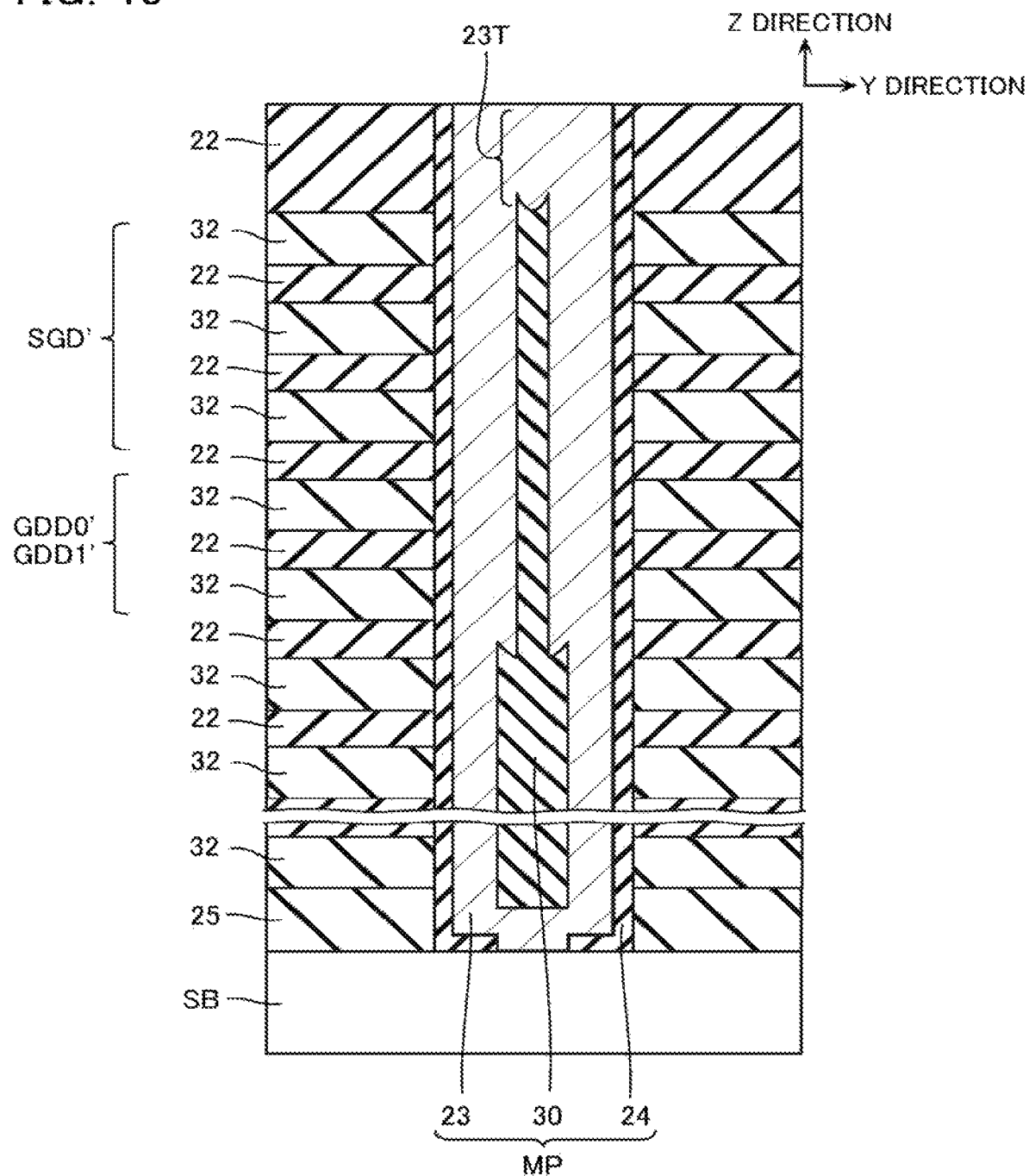
FIG. 18 is a cross-sectional view showing a manufacturing process of the non-volatile semiconductor memory device.

Subsequently, at a process shown in FIG. 18, the fifth opening op5 is embedded with a semiconductor layer made of, for example, amorphous silicon. Then, performing a certain thermal process transforms this semiconductor layer into polysilicon to form the semiconductor layer region 23T.

Figure 19:
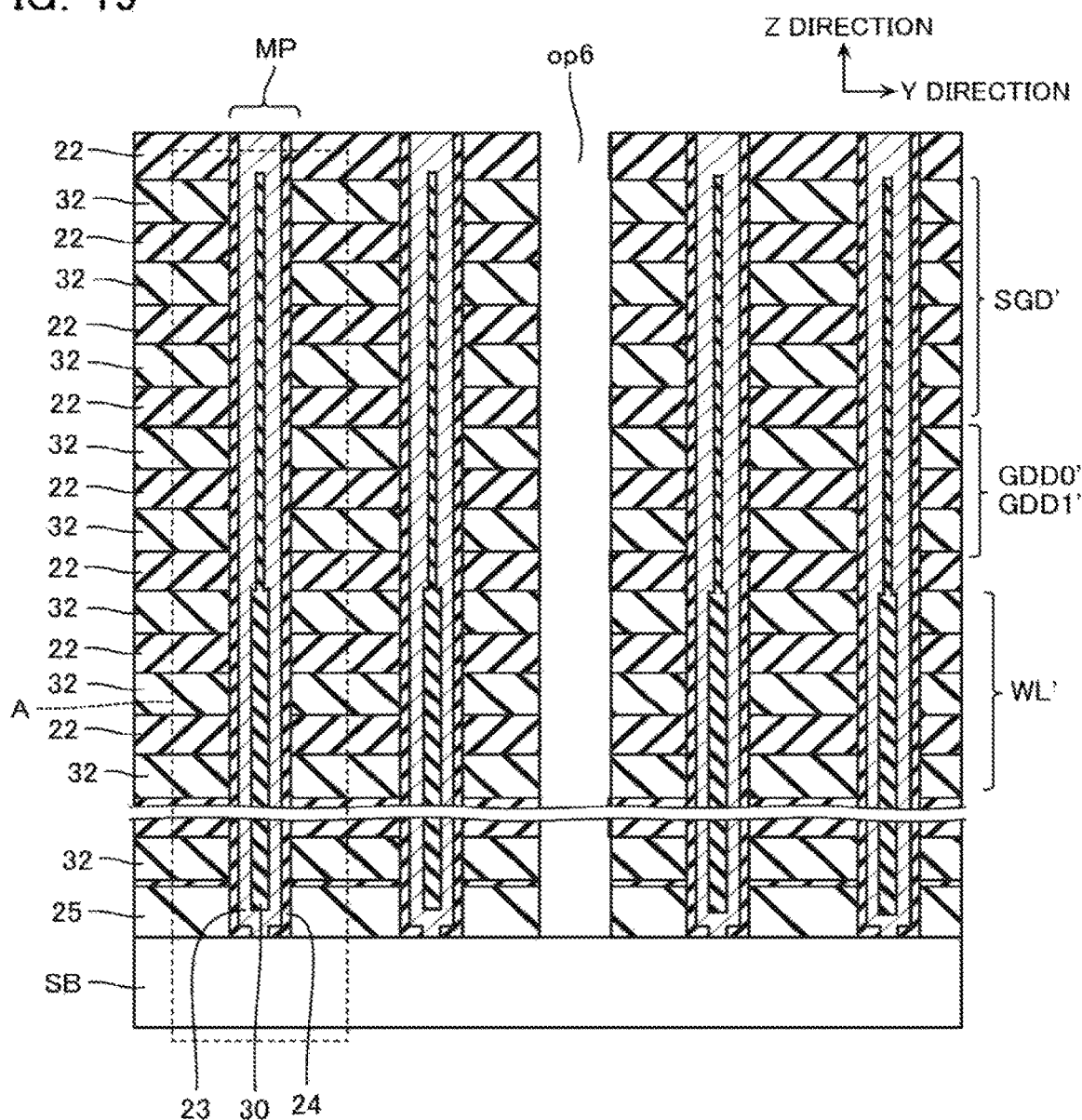
FIG. 19 is a cross-sectional view showing a manufacturing process of the non-volatile semiconductor memory device.

Next, at a process shown in FIG. 19, a sixth opening op6 which separates a laminated body including the sacrificial layers 32, the insulating layer 25, and the interlayer insulating layers 22 in the Y direction (the second direction), is formed. This opening op6 is the trench Tb shown in FIG. 3 and FIG. 4.

Figure 20:
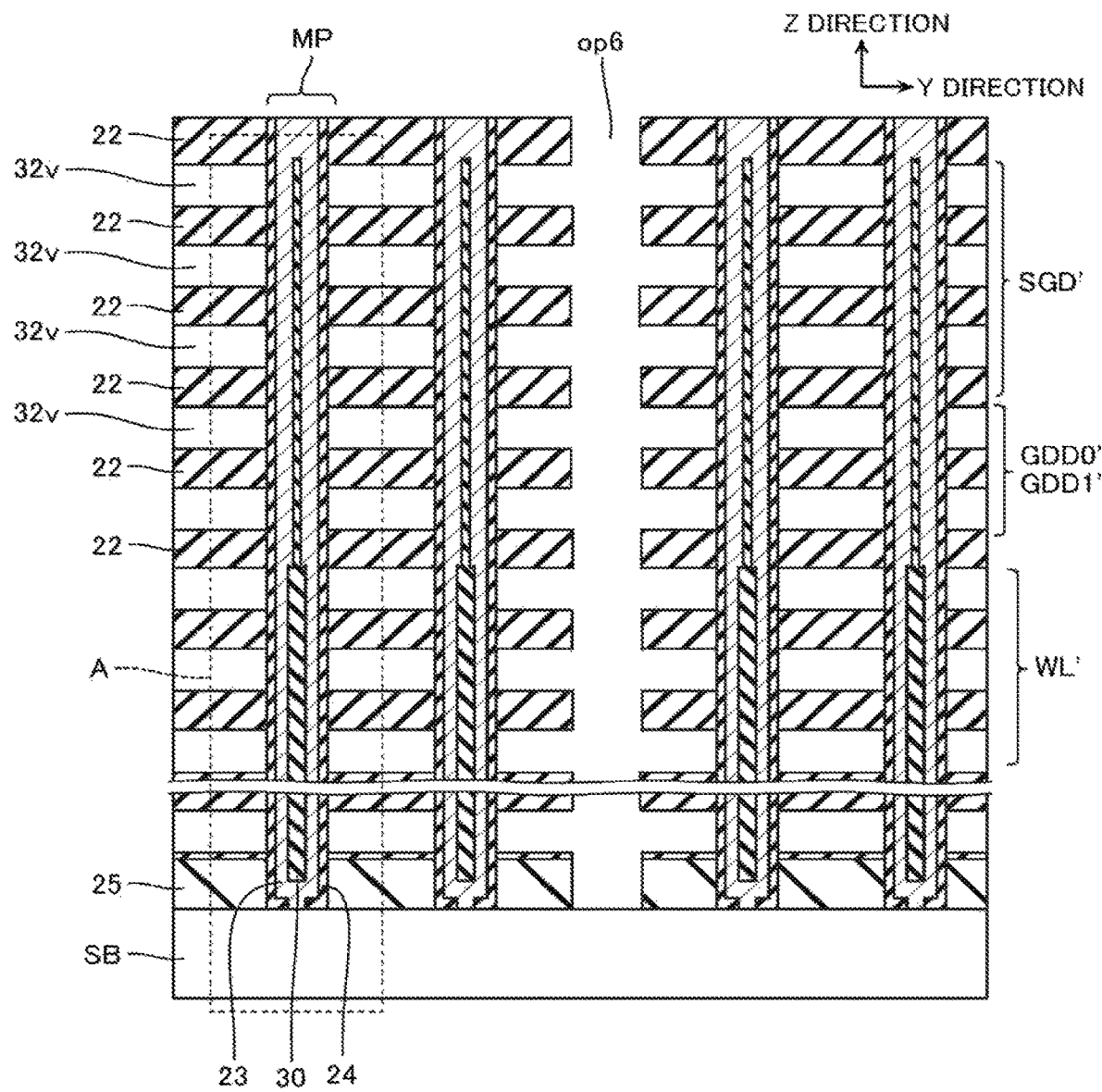
FIG. 20 is a cross-sectional view showing a manufacturing process of the non-volatile semiconductor memory device.

Next, at a process shown in FIG. 20, the sacrificial layers 32 are removed via the sixth opening op6 to form layered cavities 32v. The sacrificial layers 32 are removed by, for example, wet etching using a phosphoric acid solution.

Figure 21:
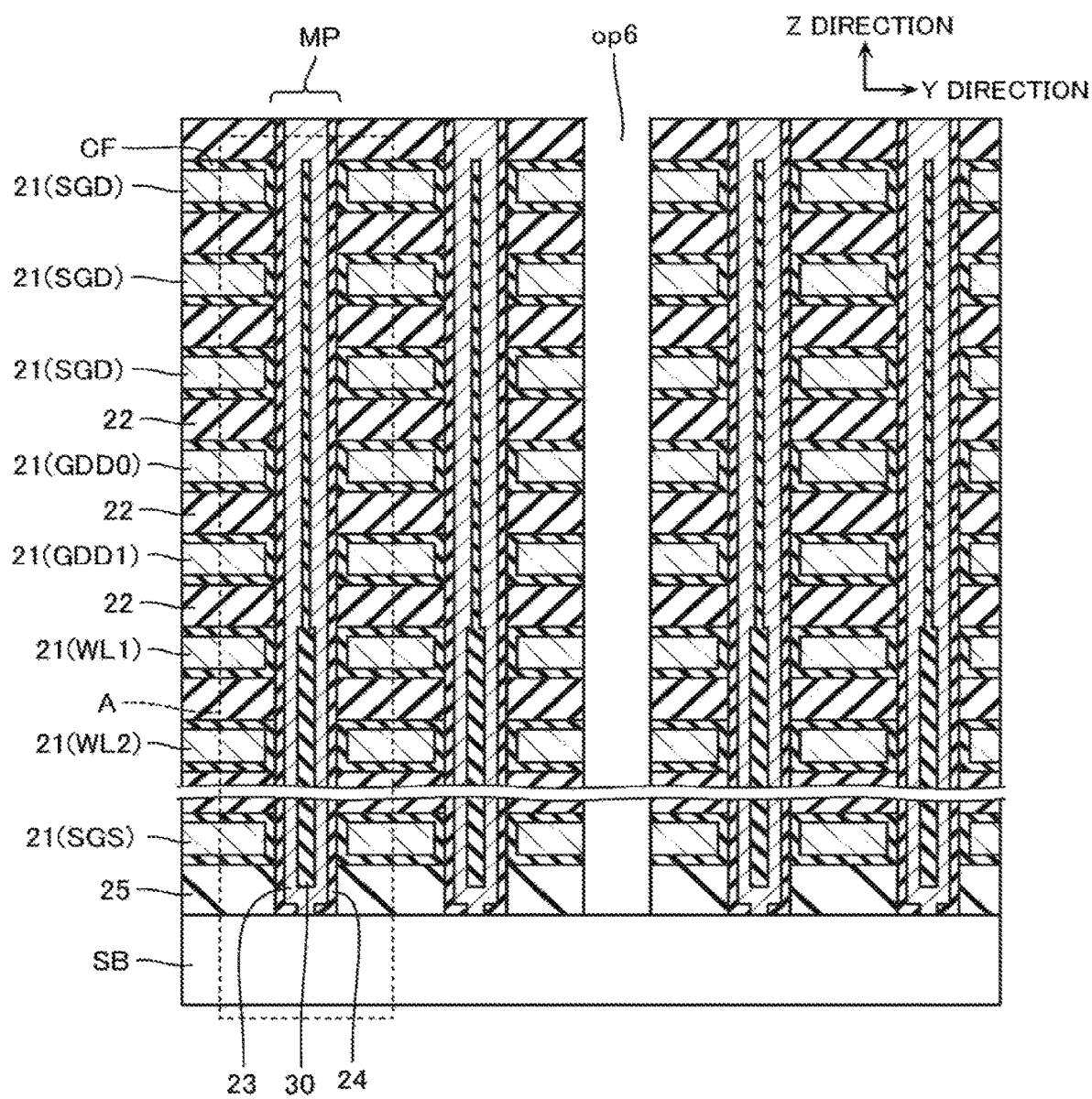
FIG. 21 is a cross-sectional view showing a manufacturing process of the non-volatile semiconductor memory device.

Subsequently, at a process shown in FIG. 21, via the opening op6, the laminated films CF and the conductive layers 21 are formed on these cavities 32v. As described above, the laminated film CF includes three layers: the barrier metal 245, the high-dielectric film 244, and the block insulating layer 243. The barrier metal 245 is made of, for example, metal nitride such as titanium nitride (TiN), tungsten nitride (WN), and tantalum nitride (TaN). The high-dielectric film 244 is made of, for example, metal oxide such as alumina ($Al_2O_3$) and hafnium oxide (HfOx). The block insulating layer 243 is made of, for example, silicon oxide ($SiO_2$). The conductive layer 21 is made of, for example, metal such as tungsten (W), or polysilicon where impurities are doped at high concentration.

Figure 22:
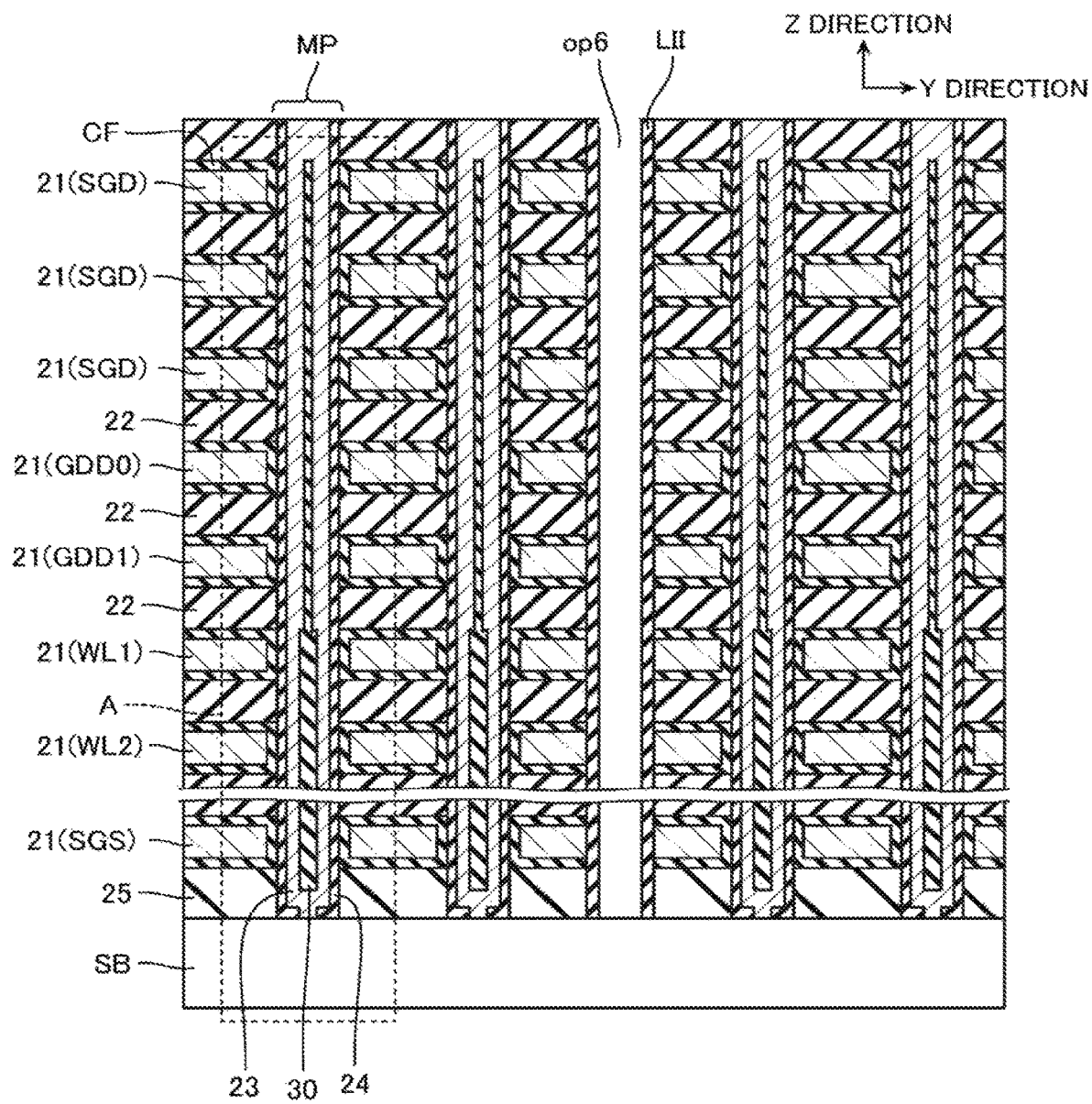
FIG. 22 is a cross-sectional view showing a manufacturing process of the non-volatile semiconductor memory device.

Then, at a process shown in FIG. 22, in the opening op6, the interlayer insulating layer LII is formed. The interlayer insulating layer LII, which is made of, for example, silicon oxide ($SiO_2$), is formed along an inner wall of the opening op6. Among the formed silicon oxide ($SiO_2$), a part covering an upper surface of the substrate SB is removed by, for example, anisotropic etching.

Figure 23:
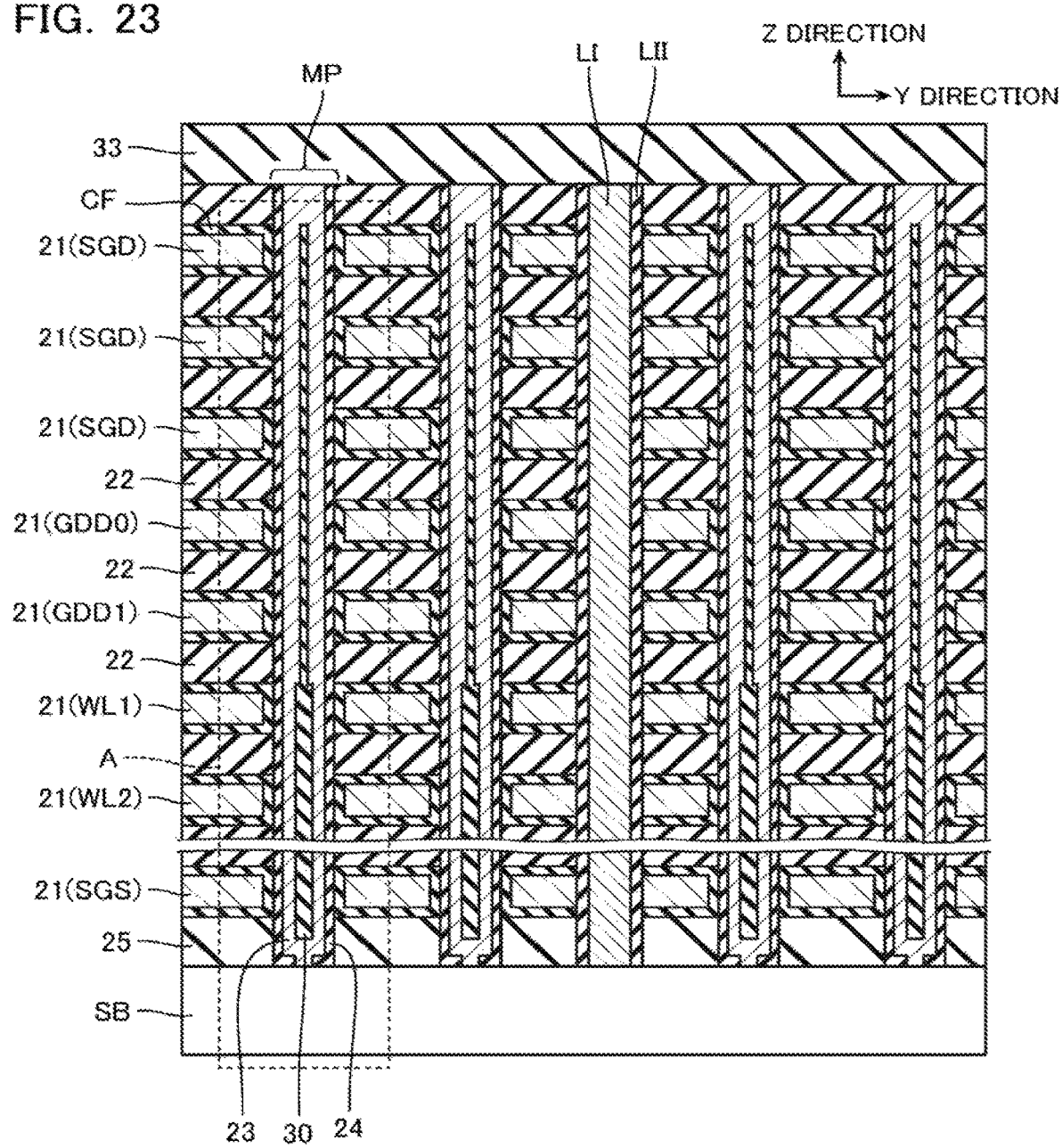
FIG. 23 is a cross-sectional view showing a manufacturing process of the non-volatile semiconductor memory device.

Next, at a process shown in FIG. 23, metal such as tungsten (W) as the source contact LI is embedded by using, for example, the CVD method. Additionally, the insulating layer 33 is formed on the source contact LI.

Figure 24:
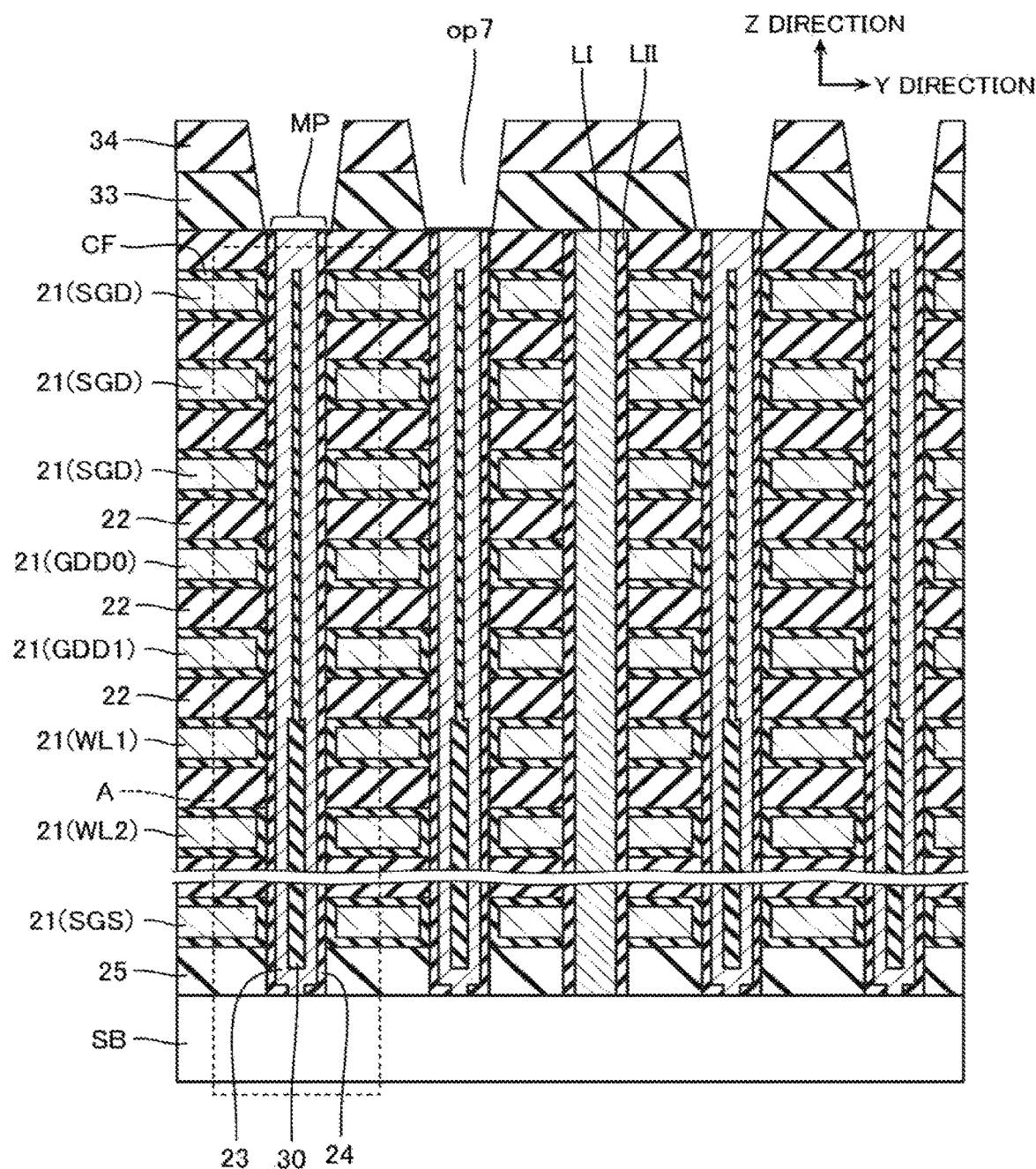
FIG. 24 is a cross-sectional view showing a manufacturing process of the non-volatile semiconductor memory device.

Thereafter, at a process shown in FIG. 24, the insulating layer 34 is formed. Next, openings op7 to connect the memory pillar MP to the bit line BL are formed as penetrating the insulating layer 33 and the insulating layer 34.

Figure 25:
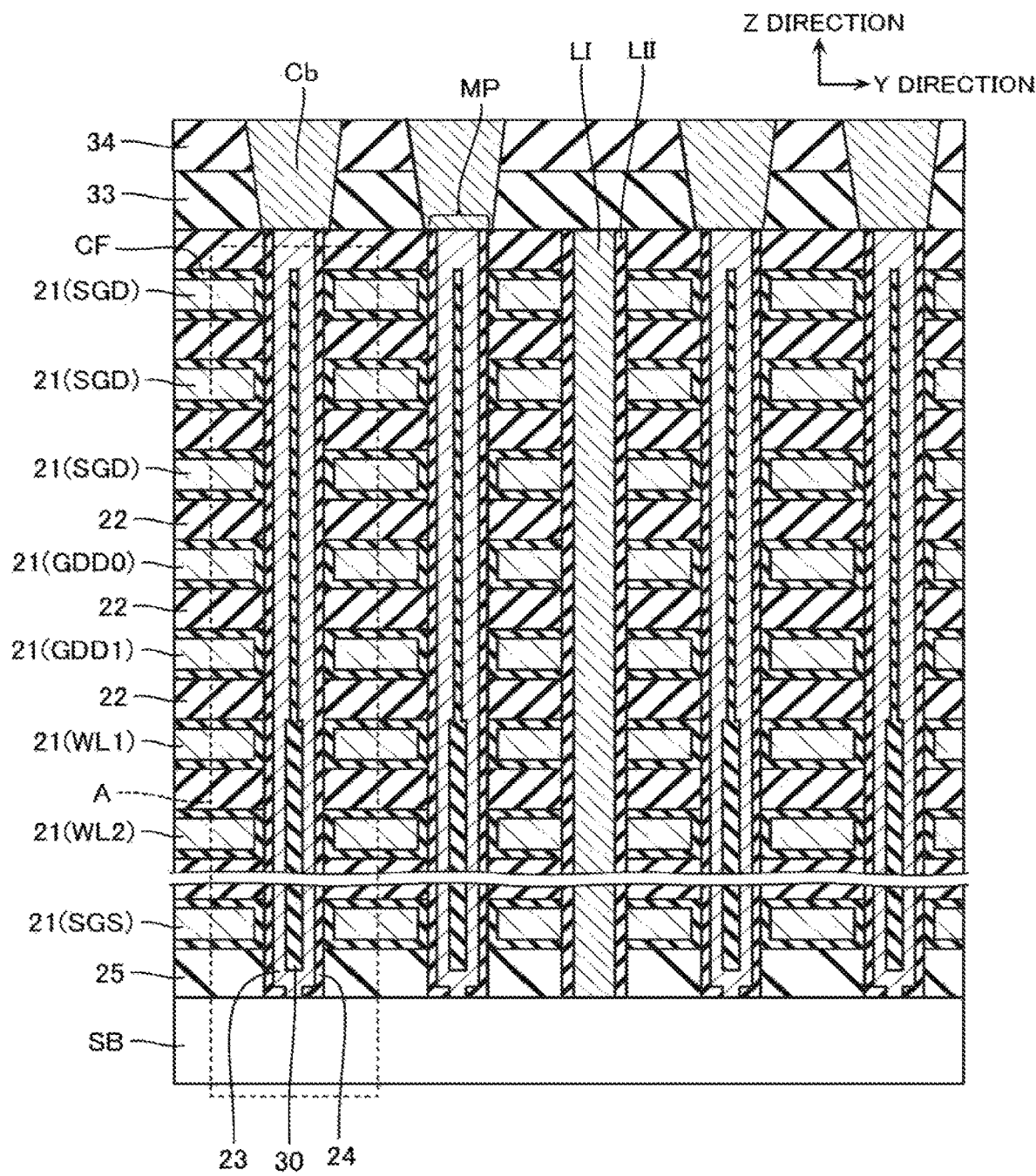
FIG. 25 is a cross-sectional view showing a manufacturing process of the non-volatile semiconductor memory device.

Then, at a process shown in FIG. 25, inside the openings op7, the contacts Cb are formed. Additionally a wiring process is performed to obtain the cross-sectional view shown in FIG. 5.

Figure 26:
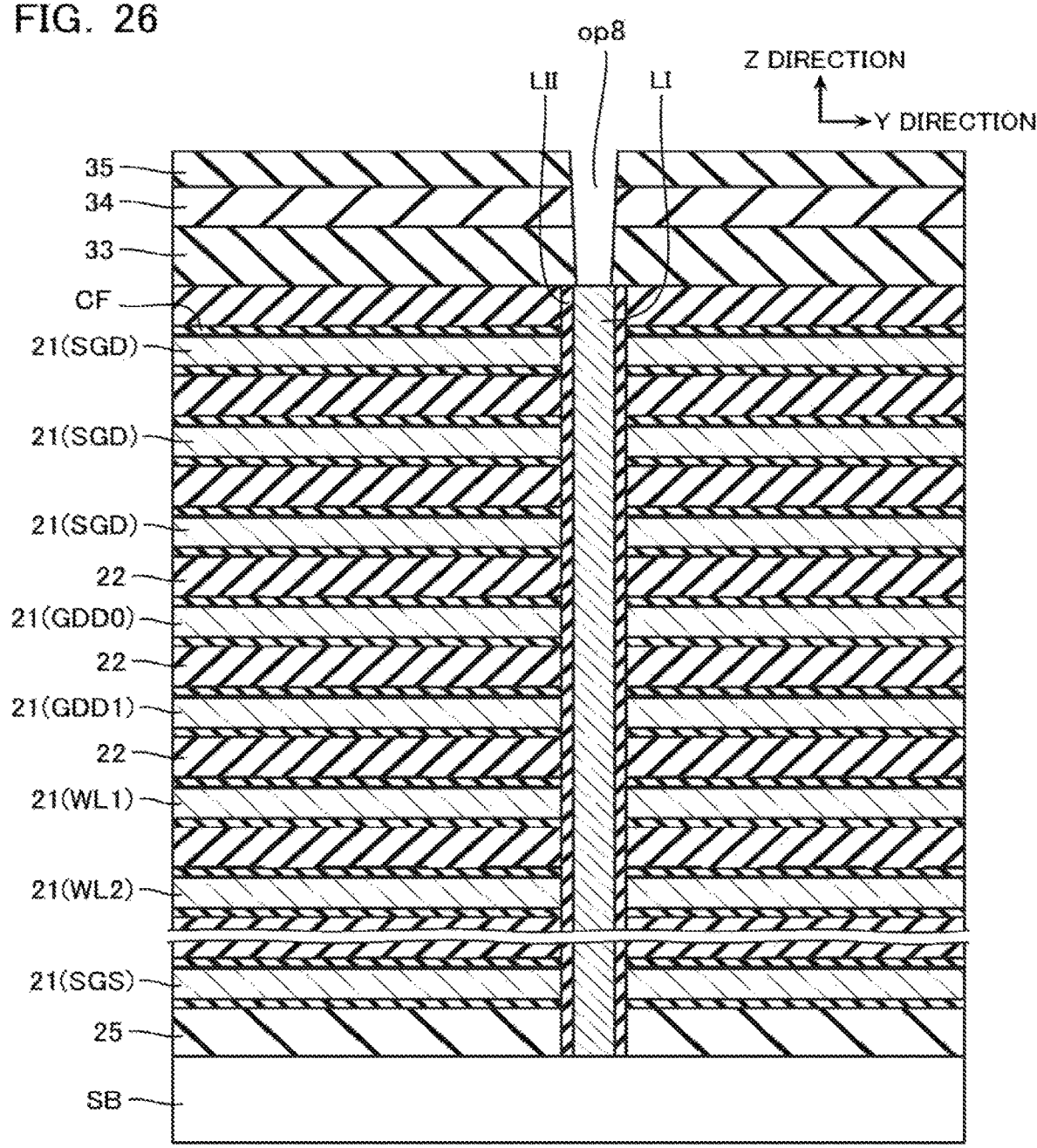
FIG. 26 is a cross view showing a manufacturing process of the non-volatile semiconductor memory device.

For the source contact region SR, at a process shown in FIG. 26, an eighth opening op8 that penetrates the insulating layer 33, the insulating layer 34, and the insulating layer 35 is formed. The wiring process that connects the source contact LI to the contact Cs and the source line SL is performed to obtain the structure shown in FIG. 7.

Second Embodiment

Figure 27:
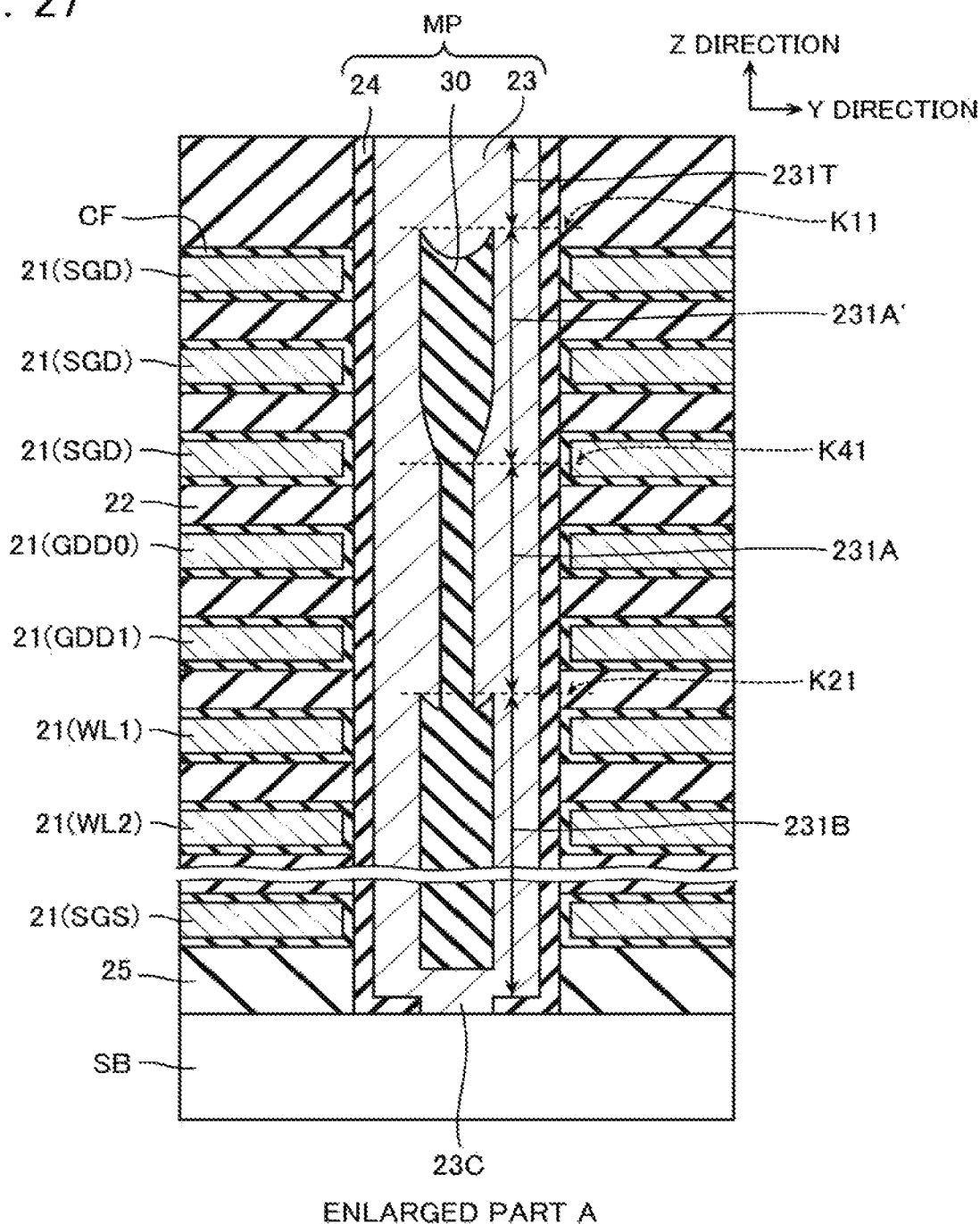
FIG. 27 is a cross-sectional view showing a part of a configuration of a non-volatile semiconductor memory device according to a second embodiment.

The following describes a non-volatile semiconductor memory device according to a second embodiment with reference to FIG. 27.

FIG. 27 is a Y-Z cross-sectional view showing a part of a configuration of the non-volatile semiconductor memory device in the second embodiment, and a drawing corresponding to FIG. 8 of the first embodiment. In FIG. 27, like reference numerals designate identical elements to the elements of FIG. 8. Therefore, the overlapped description will not be further elaborated here. A difference between FIG. 27 and FIG. 8 (the first embodiment) is a difference of a shape of the core insulating layer 30. The core insulating layer 30 in FIG. 27, at a region between a border K11 and a border K41 (a region of the drain side select gate transistors S1 to S3), has a width in the X direction or the Y direction larger than a width in the X direction or the Y direction at a region between the border K41 and a border K21 (a region of the dummy cells DD0 and DD1). Then, the core insulating layer 30 at a region of the memory cell MC below the border K21 also has a width in the X direction or the Y direction larger than the width in the X direction or the Y direction of the core insulating layer 30 at the region between the borders K41 and K21. The semiconductor layer 23 has a shape corresponding to a shape of this core insulating layer 30. That is, widths in the X direction or the Y direction of a semiconductor layer 231A' at the region between the border K11 and the border K41 is smaller than a width in the X direction or the Y direction of the semiconductor layer 231A at the region between the border K41 and the border K21. Then, a width in the X direction or the Y direction of a semiconductor layer 231B (a second portion) at the region of the memory cell MC below the border K21 is smaller than the width in the X direction or the Y direction of the semiconductor layer 231A (a first portion) at the region between the border K41 and the border K21.

Thus, in this second embodiment, a width in the X direction or the Y direction of the semiconductor layer 231A at a part of the dummy cells DD0 and DD1 is made thicker than the one of the semiconductor layer 231B at a part of the memory cell MC. And a width of the semiconductor layer 231A' at a part of the select gate transistors S1 to S3 is approximately similar to the width of the semiconductor layer 231B at a part of the memory cell MC. Thus, in the semiconductor layer 23, at least a width of a part of the semiconductor layer 23 above the memory cell MC is large compared with other. This ensures providing the effect similar to the first embodiment. That is, this can decrease potential gradient between a channel of the memory cell MC1 and a channel of the drain side select gate transistor S3. Accordingly, generation of the GIDL current, which is a cause of erroneous writing, can be suppressed. This ensures obtaining the effect similar to the first embodiment.

Method of Manufacturing

Figure 28:
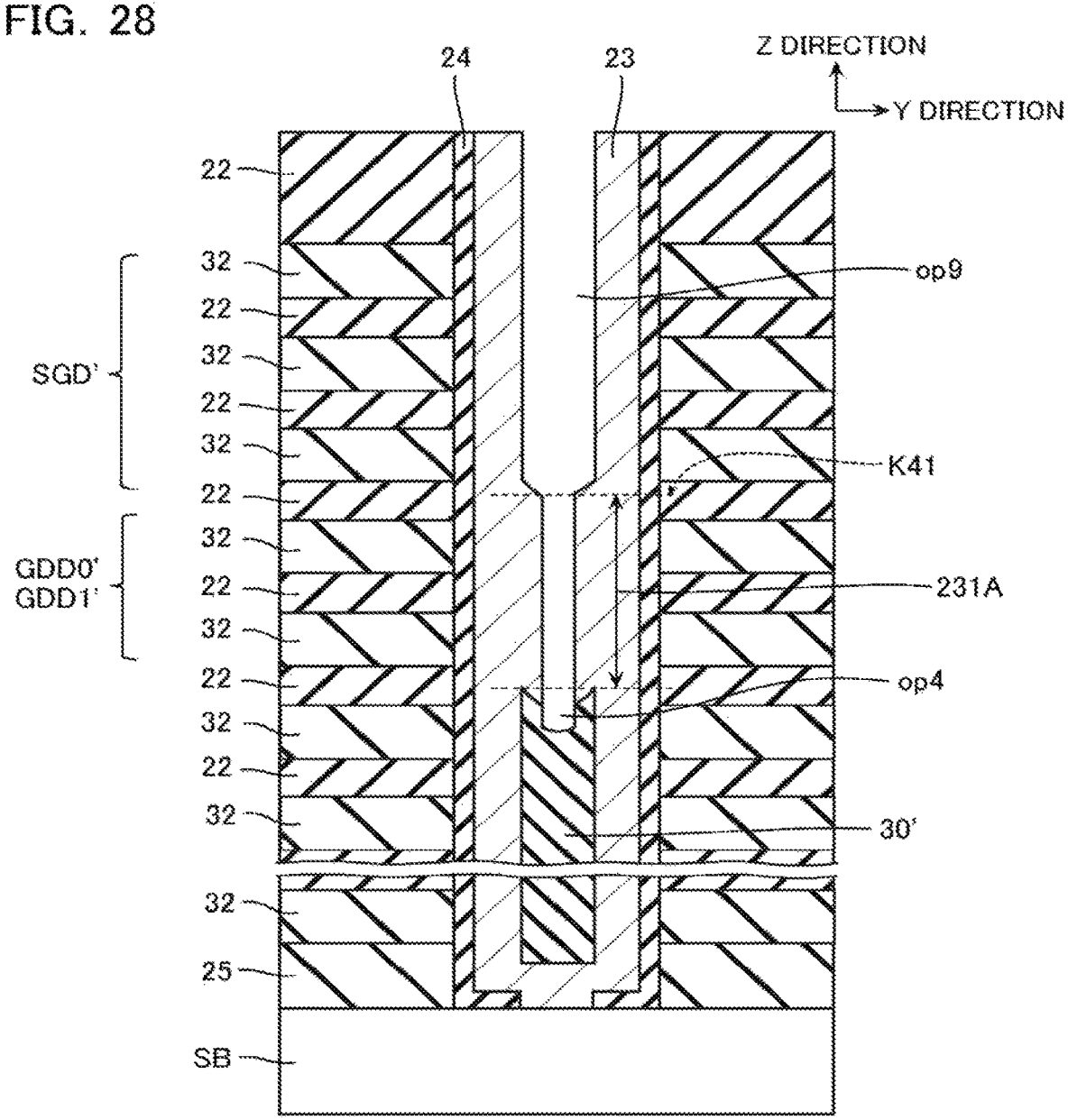
FIG. 28 is a cross view showing a manufacturing process of the non-volatile semiconductor memory device.

The following describes a method of manufacturing the non-volatile semiconductor memory device of this second embodiment with reference to FIG. 28. The method of manufacturing the non-volatile semiconductor memory device according to the second embodiment is identical to that of the first embodiment except for following points; therefore, the overlapped description is omitted. A manufacturing process in the second embodiment, after performing the processes identical to those of the first embodiment until the process shown in FIG. 15, fills photoresist from a bottom of the opening op4 to the border K41. The border K41 is a border between the drain side select gate transistor S1 and the dummy cell DD0.

Next, the semiconductor layer 23 is etched to enlarge a diameter of the opening op3 to form an opening op9 wider than the opening op3. The photoresist filled in a bottom portion of the opening op4 is removed to obtain the state shown in FIG. 28.

Figure 16:
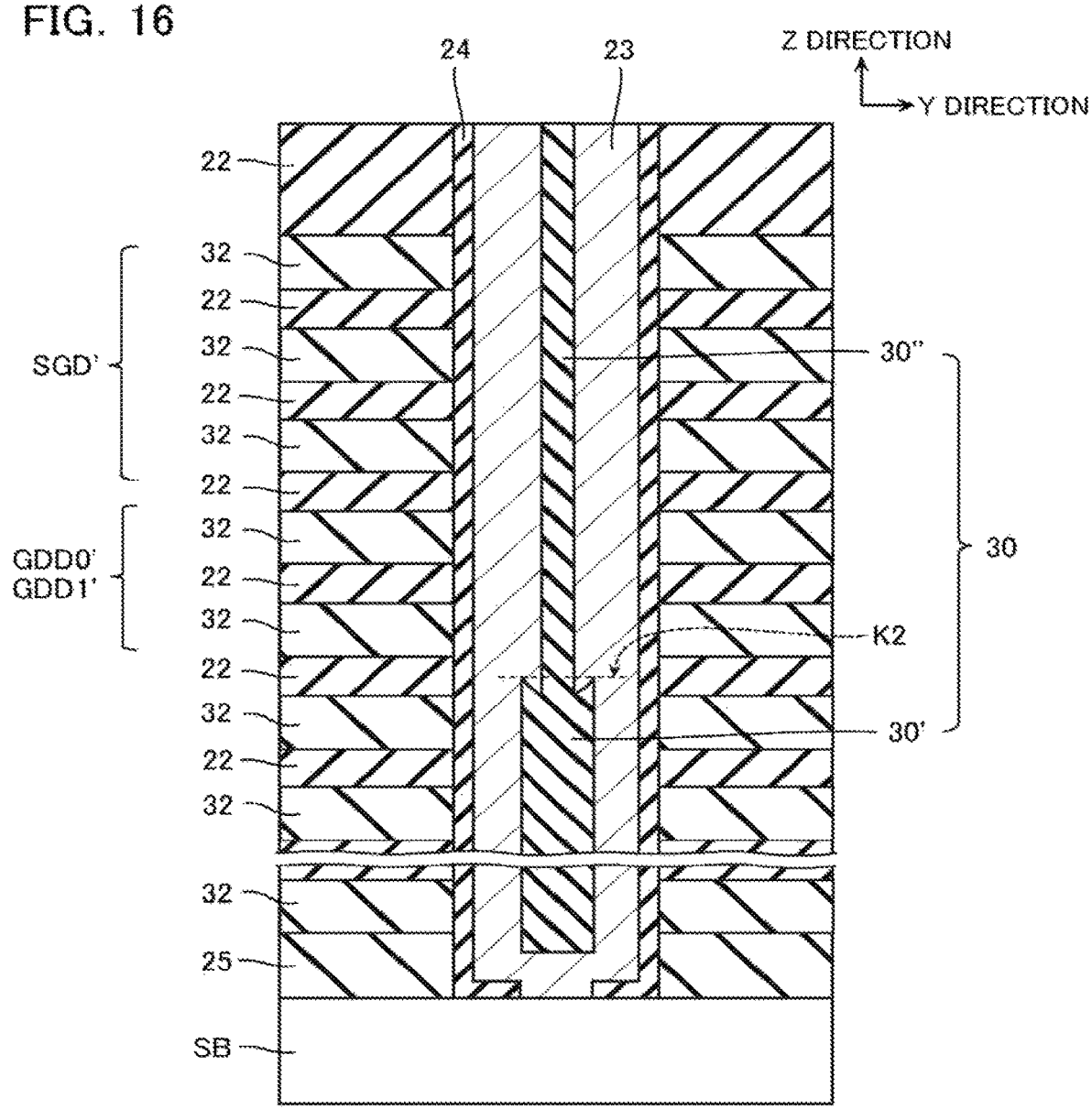
FIG. 16 is a cross-sectional view showing a manufacturing process of the non-volatile semiconductor memory device.

Next, the manufacturing process in FIG. 16 is performed to fill the core insulating layer 30. After this process, using a method of manufacturing that is approximately similar to that of the first embodiment can manufacture the non-volatile semiconductor memory device shown in FIG. 27.

Third Embodiment

Figure 29:
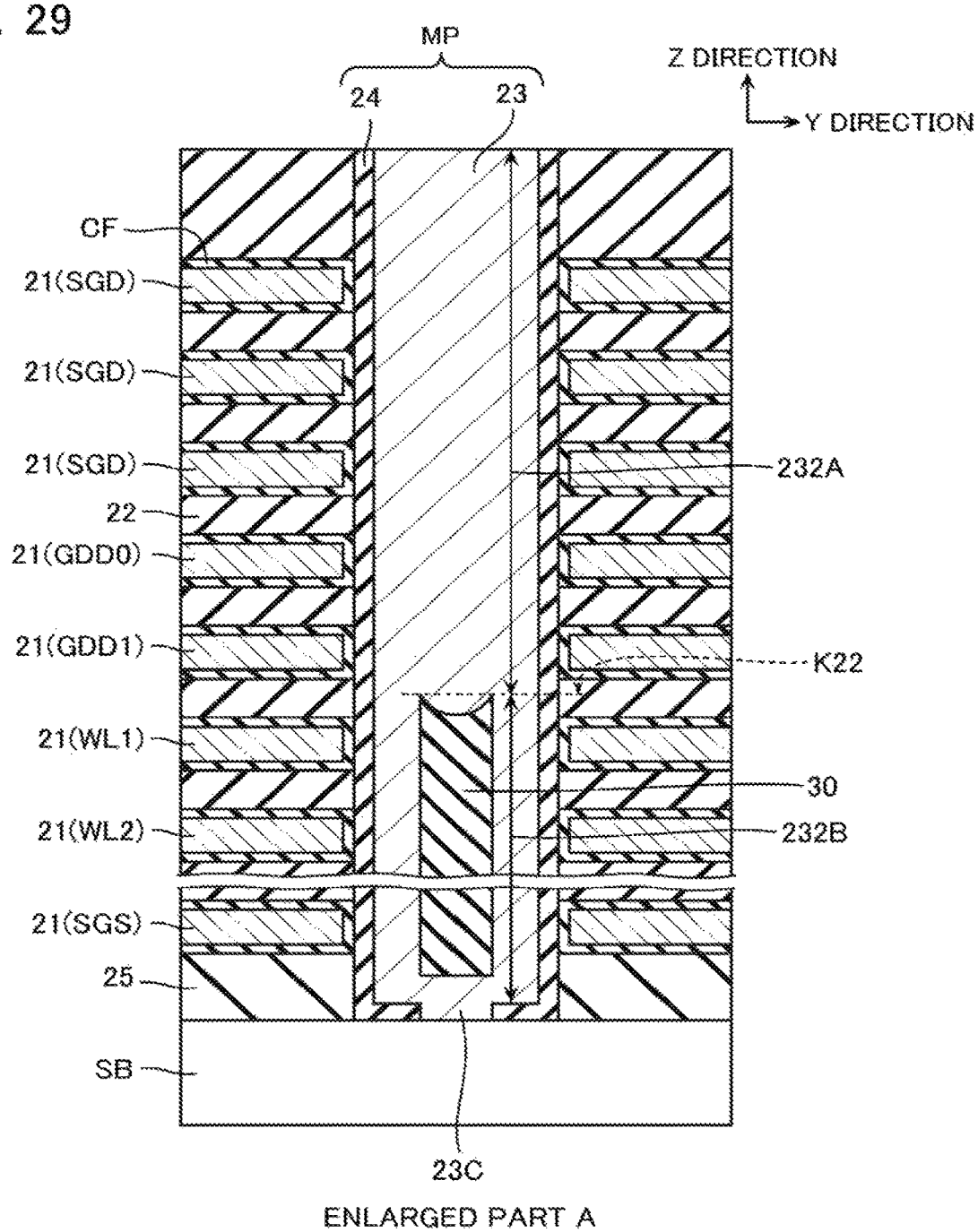
FIG. 29 is a cross-sectional view showing a part of a configuration of a non-volatile semiconductor memory device according to a third embodiment.

The following describes a non-volatile semiconductor memory device according to a third embodiment with reference to FIG. 29.

The non-volatile semiconductor memory device according to the third embodiment is identical to that of the first embodiment except for following points; therefore, the overlapped description is omitted. FIG. 29 is a Y-Z cross-sectional view showing a part of a configuration of the non-volatile semiconductor memory device in the third embodiment, and a drawing corresponding to FIG. 8 of the first embodiment. In FIG. 29, like reference numerals designate identical elements to the elements of FIG. 8. Therefore, the overlapped description will not be further elaborated here.

The semiconductor layer 23 configuring the memory pillar MP of this third embodiment is roughly divided into a first portion and a second portion. A semiconductor layer region 232A, which is the first portion, does not include the core insulating layer 30 at a center, and acts as a channel body of the drain side select gate transistors S1 to S3 and the dummy cells DD0 and DD1. On the other hand, a semiconductor layer region 232B, which is the second portion, includes the core insulating layer 30 at its center, and acts as a channel body of the memory cell MC and the source side select gate transistor S4. The semiconductor layer region 232B is positioned closer to the semiconductor substrate SB than the semiconductor layer region 232A.

The semiconductor layer region 232A has a width in the X direction or the Y direction larger than a width in the X direction or the Y direction of the semiconductor layer region 232B. Accordingly, the channel body that the semiconductor layer region 232A configures is a thicker channel body than the one of the semiconductor layer region 232B.

The border K22 is an upper end of the core insulating layer 30, and above the border K22, the core insulating layer 30 is not disposed. In other words, in the embodiment, widths in the X direction and the Y direction of the core insulating layer in the semiconductor layer region 232A are zero. The embodiment also can suppress the generation of the GIDL current, which is a cause of erroneous writing, to reduce the concern of the generation of erroneous writing.

Method of Manufacturing

A method of manufacturing the non-volatile semiconductor memory device according to the third embodiment is identical to that of the first embodiment except for following points; therefore, the overlapped description is omitted. The method of manufacturing the non-volatile semiconductor memory device of the third embodiment is identical to that of the first embodiment until the process in FIG. 13. For example, amorphous silicon is formed inside the obtained opening op2, and additionally the semiconductor layer 23 made of, for example, polysilicon is formed by heat treatment to fill the opening op2 with the semiconductor layer 23. Other processes may be approximately identical to those of the first embodiment.

Fourth Embodiment

Figure 30:
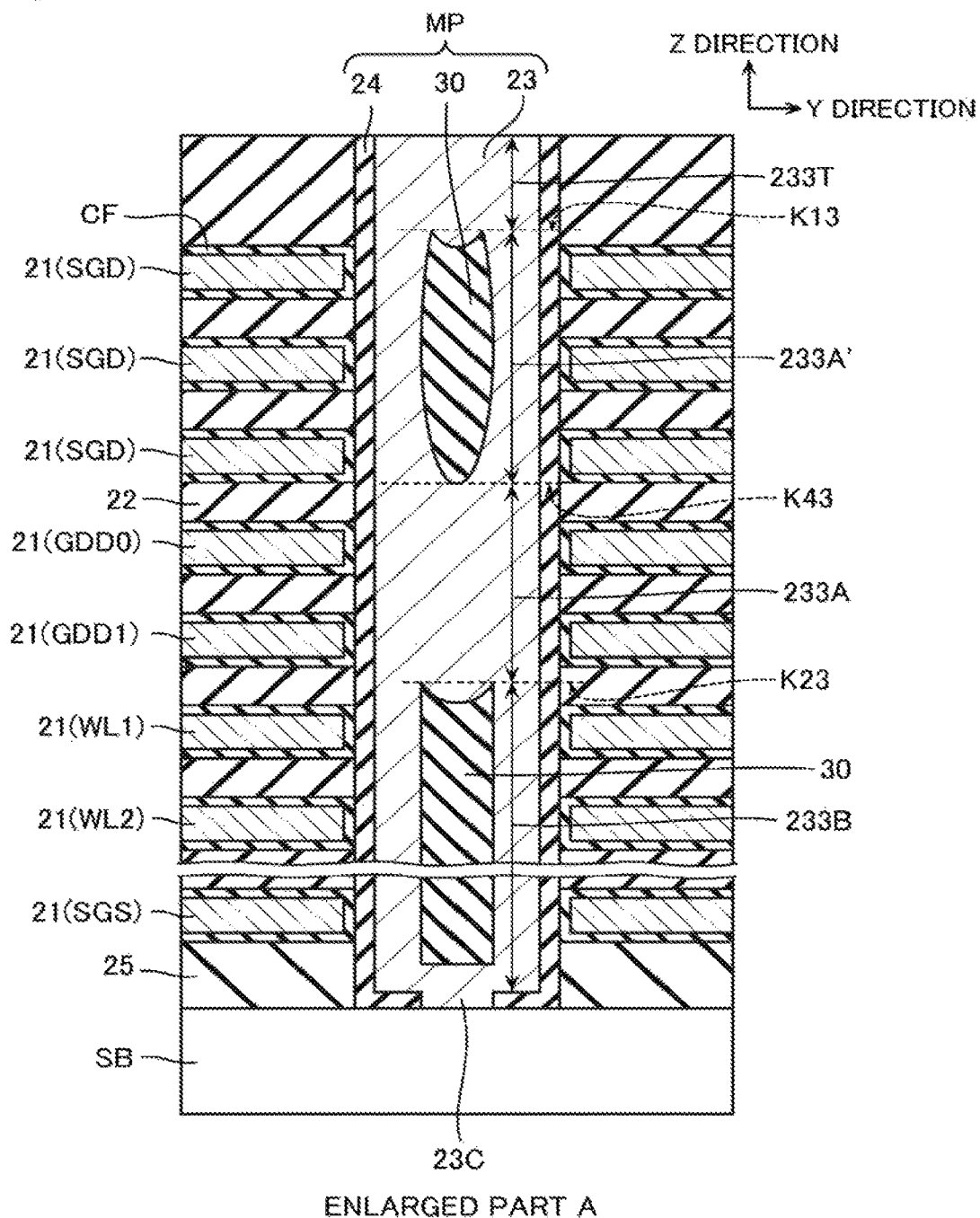
FIG. 30 is a cross-sectional view showing a part of a configuration of a non-volatile semiconductor memory device according to a fourth embodiment.

The following describes a non-volatile semiconductor memory device according to a fourth embodiment with reference to FIG. 30.

The non-volatile semiconductor memory device according to the fourth embodiment is identical to that of the second embodiment except for following points; therefore, the overlapped description is omitted. FIG. 30 is a Y-Z cross-sectional view showing a part of a configuration of the non-volatile semiconductor memory device in the fourth embodiment, and a drawing corresponding to FIG. 27 of the second embodiment. In FIG. 30, like reference numerals designate identical elements to the elements of FIG. 27. Therefore, the overlapped description will not be further elaborated here.

A difference between FIG. 30 and FIG. 27 (the second embodiment) is a difference of the shape of the core insulating layer 30. While in FIG. 27 the thin core insulating layer 30 exists between the border K41 and the border K21, the core insulating layer 30 does not exist between a border K43 and a border K23, which correspond to this region in FIG. 30. This is the difference between the second embodiment and the fourth embodiment. The embodiment also can suppress the generation of the GIDL current, which is a cause of erroneous writing, to reduce the concern of the generation of erroneous writing.

Method of Manufacturing

Figure 31:
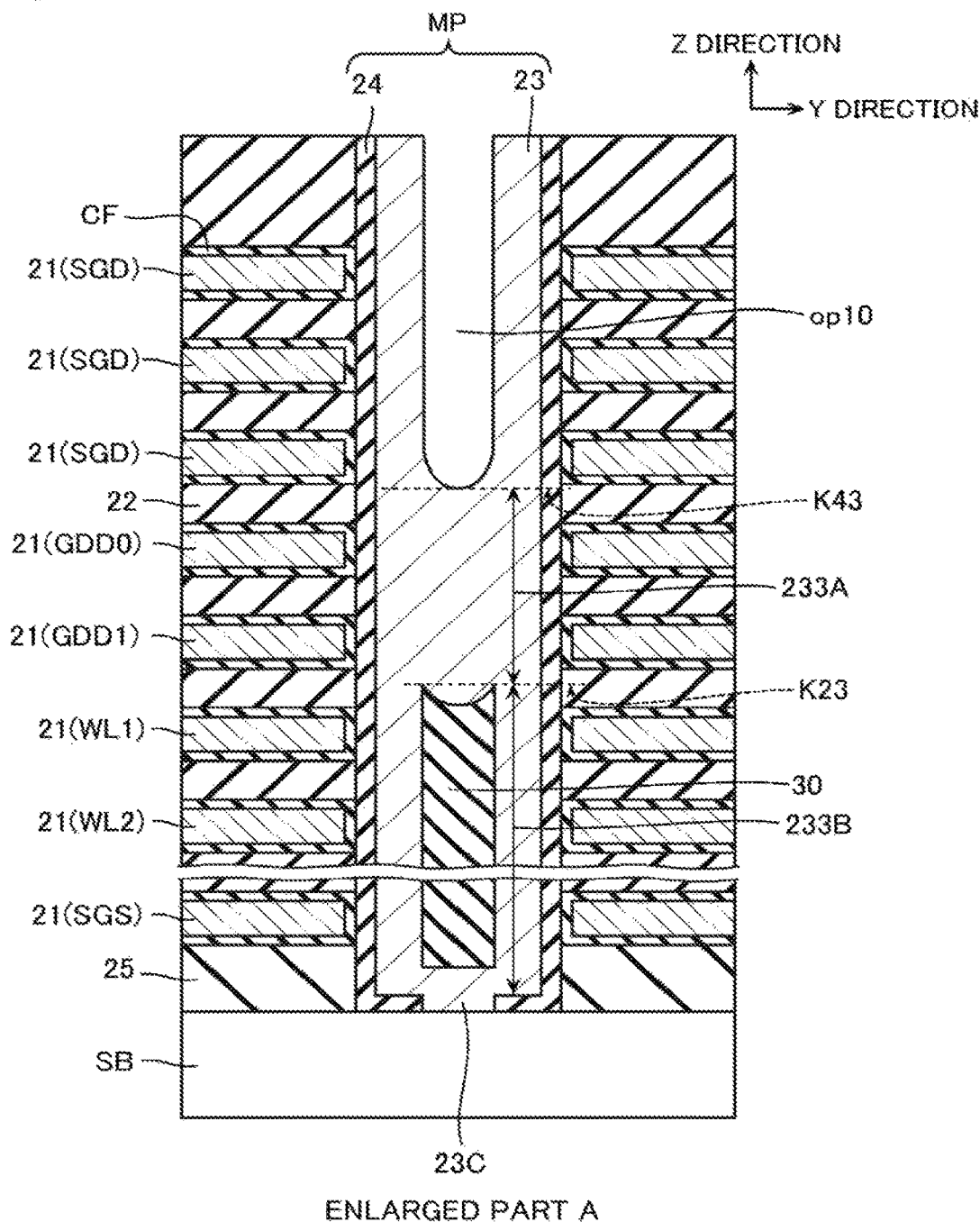
FIG. 31 is a cross-sectional view showing a manufacturing process of the non-volatile semiconductor memory device.

A method of manufacturing the non-volatile semiconductor memory device according to the fourth embodiment is identical to that of the first embodiment except for following points; therefore, the overlapped description is omitted. After performing the manufacturing processes similar to those of the first embodiment until the process in FIG. 13, for example, amorphous silicon is formed inside the obtained opening op2, and additionally the semiconductor layer 23 made of, for example, polysilicon is formed by heat treatment to fill the opening op2 with the semiconductor layer 23. Next, at a process shown in FIG. 31, the semiconductor layer 23 is etched from an upper portion to the border K43 to form an opening op10.

Next, the opening op10 is embedded with a laminated film made of, for example, silicon oxide ($SiO_2$) to form the core insulating layer 30. Thereafter, the core insulating layer 30 is etched from an upper portion to the border K13. Then, polysilicon is further embedded in a void portion after the etching to complete a structure shown in FIG. 30.

Others

While these embodiments have been described, the embodiments have been presented by way of example only, and are not intended to limit the scope of the inventions. Indeed, the novel method and system described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

In the embodiments, the configuration where a lower end of the memory pillar MP contacts the top surface of the semiconductor substrate SB is described. However, even a configuration where the lower end of the memory pillar MP is embedded inside the semiconductor substrate SB has an entirely similar effect for an effect of a shape of a contact according to the embodiments. Therefore, the configuration is obviously not limited to the configuration described in the embodiments.

What is claimed is:

1. A semiconductor memory device comprising:
a substrate;
a plurality of first control gate electrodes arranged in a first direction and extending in a second direction and a third direction, the first direction intersecting with the substrate, the second direction intersecting with the first direction, and the third direction intersecting with the first direction and the second direction;
a plurality of second control gate electrodes arranged in the first direction and extending in the second direction and the third direction, the plurality of second control gate electrodes being provided between the plurality of the first control gate electrodes and the substrate;
a memory string including a plurality of memory cells and a dummy cell connected to the memory cell in series;
a select gate transistor connected to the memory string, one of the plurality of first control gate electrodes being a gate of the select gate transistor; and
a memory pillar extending in the first direction, the memory pillar including a core insulating layer extending in the first direction, a semiconductor layer arranged between the core insulating layer and the plurality of the first control gate electrodes and between the core insulating layer and the plurality of the second control gate electrodes, and a charge accumulation layer arranged between the semiconductor layer and one of the first control gate electrodes and the plurality of second control gate electrodes, wherein
the semiconductor layer includes a first portion and a second portion, the second portion being provided between the first portion and the substrate,
the first portion extends in the first direction, and includes a first surface and a second surface in the second direction or the third direction, the first surface facing the plurality of the first control gate electrodes in the second direction or the third direction, and the second surface being connected to the core insulating layer,
the second portion extends in the first direction, and includes a third surface and a fourth surface, the third surface facing the plurality of the second control gate electrodes in the second direction or the third direction, and the fourth surface being connected to the core insulating layer,
a distance between the first surface and the second surface of the first portion of the semiconductor layer in the second direction or the third direction at a position of the select gate transistor is larger than a distance between the third surface and the fourth surface of the second portion of the semiconductor layer in the second direction or the third direction,
the core insulating layer includes a third portion and a fourth portion,
the third portion is provided on the second surface of the first portion of the semiconductor layer,
the fourth portion is provided on the fourth surface of the second portion of the semiconductor layer, and
a width in the second direction or the third direction of the fourth portion of the core insulating layer is larger than a width in the second direction or the third direction of the third portion of the core insulating layer.

2. The semiconductor memory device according to claim 1, wherein an end in the first direction of the first portion of the semiconductor layer and an end in the first direction of the third portion of the core insulating layer are connected to an end in the first direction of the fourth portion of the core insulating layer.

3. The semiconductor memory device according to claim 1, wherein
at least one of the plurality of the memory cells corresponds to: one of the plurality of the second control gate electrodes; a part of the second portion of the semiconductor layer; and a part of the charge accumulation layer, and
the dummy cell corresponds to: one of the plurality of the first control gate electrodes; and at least a part of the first portion of the semiconductor layer.

* * * * *